(12) United States Patent
Kishimoto

(10) Patent No.: US 10,876,199 B2
(45) Date of Patent: Dec. 29, 2020

(54) VAPOR DEPOSITION MASK, VAPOR DEPOSITION METHOD, AND PRODUCTION METHOD FOR ORGANIC EL DISPLAY DEVICE

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/616,440

(22) PCT Filed: Dec. 25, 2017

(86) PCT No.: PCT/JP2017/046412
§ 371 (c)(1),
(2) Date: Mar. 18, 2020

(87) PCT Pub. No.: WO2019/130389
PCT Pub. Date: Jul. 4, 2019

(65) Prior Publication Data
US 2020/0263287 A1 Aug. 20, 2020

(51) Int. Cl.
*H01L 51/40* (2006.01)
*C23C 14/04* (2006.01)
(Continued)

(52) U.S. Cl.
CPC ............ *C23C 14/042* (2013.01); *H01L 51/56* (2013.01); *H05B 33/10* (2013.01)

(58) Field of Classification Search
CPC ........ C23C 14/042; C23C 14/04; H01L 51/56; H01L 27/32; H01L 51/50; H05B 33/10
See application file for complete search history.

(56) References Cited

U.S. PATENT DOCUMENTS 5,277,854 A  1/1994 Hunt
2014/0033975 A1* 2/2014 Oh .................... H01L 21/02104
                                                        118/504
(Continued)

FOREIGN PATENT DOCUMENTS

JP  H04-261840 A  9/1992
JP  H07-189417 A  7/1995
(Continued)

OTHER PUBLICATIONS

International Search Report of International Application No. PCT/JP2017/046412.

*Primary Examiner* — Ismail A Muse
(74) *Attorney, Agent, or Firm* — ScienBiziP, P.C.

(57) ABSTRACT

Provided is a vapor deposition mask that suppresses heat conduction at a frame thereof, that achieves weight reduction, and that can tolerate high stress at a portion of the frame to which particularly high stress is applied. The present invention has: a mask main body (10) at which an opening pattern is formed; and a frame (15) to which at least a portion of a peripheral edge part of the mask main body is joined. At least a portion of the frame is formed as a rod-like lateral frame (15b) that is formed by laminating, via connection surface plates (153), unit structures (155) for a sandwich structure in which a surface plate (152) is stuck to a surface that faces at least portions of core parts (151) that contain vacant space.

12 Claims, 14 Drawing Sheets

(51) Int. Cl.
*H01L 51/56* (2006.01)
*H05B 33/10* (2006.01)

(56) References Cited

U.S. PATENT DOCUMENTS

| | | | | |
|---|---|---|---|---|
| 2015/0037928 | A1* | 2/2015 | Hirobe | B05B 12/20 438/99 |
| 2016/0163983 | A1* | 6/2016 | Hirobe | C23C 14/24 118/720 |
| 2017/0343894 | A1* | 11/2017 | Ishito | B23K 20/00 |
| 2019/0100834 | A1* | 4/2019 | Sakio | C23C 14/24 |
| 2020/0259090 | A1* | 8/2020 | Sone | C23C 16/042 |
| 2020/0273735 | A1* | 8/2020 | Ikenaga | H01L 51/56 |

FOREIGN PATENT DOCUMENTS

| | | |
|---|---|---|
| JP | 2003-191359 A | 7/2003 |
| JP | 2003-336200 A | 11/2003 |
| JP | 2005-232474 A | 9/2005 |
| JP | 2006-322015 A | 11/2006 |
| JP | 2009-007649 A | 1/2009 |
| JP | 2014-031569 A | 2/2014 |
| JP | 2014-194062 A | 10/2014 |
| JP | 2014-205870 A | 10/2014 |
| WO | 2014/155939 A1 | 10/2014 |

* cited by examiner

VAPOR DEPOSITION MASK, VAPOR DEPOSITION METHOD, AND PRODUCTION METHOD FOR ORGANIC EL DISPLAY DEVICE

TECHNICAL FIELD

The present invention relates to a vapor deposition mask, a vapor deposition method, and a method for manufacturing organic EL display apparatus that vapor deposits an organic layer of an organic EL display apparatus, for example.

BACKGROUND ART

When an organic EL display apparatus is manufactured, a driving element such as a TFT is formed on a substrate, on which an electrode of the TFT, an organic layer is deposited in correspondence for each pixel. This organic layer is susceptible to moisture, so that it cannot be subjected to etching. Therefore, as shown in FIG. 8, for example, deposition of an organic layer 80 is carried out by overlapping a vapor deposition mask 82 comprising a mask body 821 and a frame 822, and a substrate 81 to be vapor deposited, and vapor depositing an organic material 85a from a vapor deposition source 85 through an aperture 821c of the vapor deposition mask 82. Then, the organic layer 80 is deposited on an electrode 81a surrounded by an insulating layer 81b only for a pixel to be necessary. This substrate 81 to be vapor deposited and the vapor deposition mask 82 are necessary to be as proximate as possible for the organic layer 80 to be formed accurately only at a pixel region. A display image tends to be blurred unless the organic material is deposited only at the accurate pixel region. Thus, a magnetic chuck method is used in which a metal supporting layer 821b made of a magnetic material is used for the vapor deposition mask 82, and the substrate 81 to be vapor deposited is interposed between the vapor deposition mask 82 and an electromagnet or a permanent magnet 83. Therefore the magnet is arranged such that it is fixed with a resin 84 so as to face a surface opposite to the vapor deposition mask 82 of the substrate 81 to be vapor deposited, thereby making the substrate 81 to be vapor deposited and the vapor deposition mask 82 proximate as possible by magnetic force (see Patent Document 1, for example).

While a metal mask is used conventionally as the vapor deposition mask, it is considered to use a hybrid type mask 821 in which a resin film 821a and a metal supporting layer 821b provided on the resin film 821a so as to support a portion except for a peripheral edge of the aperture 821c of the resin film 821a as a mask body 821. This vapor deposition mask 82 is formed by fixing it to a frame 822 at a peripheral edge of the mask body 821 to stabilize the mask body 821 and to make handling of the mask body 821 convenient. In FIG. 8, reference numeral 821d is an aperture at the metal supporting layer 821b that is formed to be larger than the aperture 821c so as not to close an aperture 821c of the resin film 821a. A peripheral edge of the metal supporting layer 821b is fixed, with welding, to a frame 822 formed with a metal such as invar, which has a low thermal expansion coefficient.

PRIOR ART DOCUMENT

Patent Document

Patent Document 1: JP 2014-25870 A

SUMMARY OF THE INVENTION

Problem to be Solved by the Invention

As described previously, with respect to the vapor deposition mask 82, the peripheral edge of the mask body 821 is joined to the frame 822. However, as evident from FIG. 8, at the time of vapor deposition, the frame 822 is most proximate to the vapor deposition source 85. Therefore, the temperature of the frame 822 is most likely to rise, heat of the frame 822 heated is transmitted to the substrate 81 to be vapor deposited and the mask body 821 of the vapor deposition mask 82, and the temperature of the substrate 81 to be vapor deposited is also likely to rise. As the frame 822 is solid and weighty, causing the thermal capacity to increase, it is likely to hold the temperature once risen. As a result, the substrate 81 to be vapor deposited is likely to rise in temperature at the peripheral edge more than at the center thereof. In other words, there is a problem that the difference in thermal expansion of the substrate 81 to be vapor deposited is produced, making it not possible to form a uniform organic layer 80.

More specifically, this temperature distribution problem becomes conspicuous when the substrate to be vapor deposited and the vapor deposition mask are upsized. However, capsizing is further demanded for the vapor deposition mask also with respect to cutting down cost by mass production. In other words, while the maximum size of the substrate to be vapor deposited (the so-called size of a mother glass) in the process for manufacturing an organic EL display apparatus at the present is G6H (half the size of the 6th generation (approximately 1500 mm×1800 mm), or, in other words, approximately 1500 mm×900 mm), the size of the mother glass to be used in the preceding manufacturing process of the liquid crystal panel is over G10 (approximately 2880 mm×3130 mm), so that there is a strong demand for achieving further upsizing even with the organic EL display apparatus. However, in the process for manufacturing an organic EL display apparatus, it is considered difficult to make the substrate size larger than G6H. One of the factors is a problem of weight of the vapor deposition mask.

With respect to the weight, the weight of the frame reaches approximately 80 kg even with the size of G6H as described above, which, with this weight, is close to the limit for a robot arm to convey the vapor deposition mask, so that further increasing the weight is not possible. However, from the point of view of preventing misalignment between the substrate to be vapor deposited and the vapor deposition mask due to thermal expansion at the time of vapor deposition, taking into account that the material of the frame of the vapor deposition mask is a material whose linear expansion coefficient is small and that tension is applied to the mask body to perform joining, there is a constraint that the frame cannot be made slimmer or thinner compared to that at the present. Thus, it is also not possible to effortlessly change the material of the present frame to a lighter material.

The present invention is made to solve such problems. An object of the present invention is to provide a vapor deposition mask and a vapor deposition method using the above-mentioned vapor deposition mask that make it possible to suppress heat conduction in the frame of the vapor deposition mask and to reduce the weight of the vapor deposition mask to achieve upsizing and carry out high definition vapor deposition cheaply. Furthermore it is to meet the weight and heat conduction requirements described previously while having, for the frame to which a particularly large stress is applied to each side of the vapor deposition mask being frame shaped, resistance even to such a large stress.

Another object of the present invention is to provide a method of manufacturing a large-sized organic EL display apparatus having excellent display definition using the above-described vapor deposition method.

Means to Solve the Problem

A vapor deposition mask according to a first embodiment of the present invention comprises: a mask body at which an aperture pattern is formed; and a frame to which at least a part of a peripheral edge of the mask body is joined to hold the mask body at a certain state, wherein at least a part of the frame is formed by a columnar-shaped body in which unit structure bodies are stacked via a connecting end plate, each of the unit structure bodies comprising a core portion encompassing a vacant space therein and end plates provided on opposite end surfaces of at least a part of the core portion, thereby forming a sandwich structure.

A method of vapor deposition according to a second embodiment of the present invention comprises: arranging a substrate to be vapor deposited and the above vapor deposition mask such that the substrate to be vapor deposited and the vapor deposition mask overlap each other; and depositing a vapor deposition material onto the substrate to be vapor deposited by flying away the vapor deposition material from a vapor deposition source arranged at a distance from the vapor deposition mask.

A method for manufacturing an organic EL display apparatus according to a third embodiment of the present invention comprises: forming at least a TFT and a first electrode on a supporting substrate; vapor depositing an organic material above the supporting substrate using the method of vapor deposition to form an organic deposition layer; and forming a second electrode on the organic deposition layer.

Effects of the Invention

According to the present invention, at least a part of the frame is formed as a columnar-shaped body formed by stacking, via a connecting end plate, unit structure bodies having a sandwich structure, in each of which end plates are bonded to opposite end surfaces of at least a part of the core portion, so that, even in a case that a large stress acts in the axial direction of the columnar-shaped frame, sufficient rigidity is obtained. In other words, it is known that a unit structure body having a honeycomb structure in which hexagonal through holes are arranged in parallel, for example, has sufficient rigidity even to a large stress in a direction being parallel to the axial direction of the hexagonal through hole. And when a plurality of the unit structure bodies are stacked such that the axial direction of the through holes thereof are aligned to form a columnar-shaped body, it demonstrates rigidity even to a very large stress. In other words, while it is very difficult to manufacture an integral honeycomb structure body having through holes in the axial direction in a columnar-shaped body, even in a case that the above-mentioned integral honeycomb structure of the columnar-shaped body can be manufactured, the buckling strength decreases as the length thereof increases, so that the integral honeycomb structure columnar-shaped body cannot sufficiently endure a large stress. However, a columnar-shaped body being formed as a stacked body of the unit structure bodies can sufficiently endure a large stress even when the length thereof increases.

Moreover, by forming the above-mentioned sandwich structure body having vacant space, the weight can be substantially reduced. Moreover, having the vacant space causes conduction of heat to be suppressed substantially and conduction of heat due to radiation from a vapor deposition source at the time of vapor deposition to be suppressed substantially. Furthermore, a weight reduction also causes a thermal capacity reduction, making it possible to suppress heat accumulation even when vapor deposition is carried out continuously while replacing a substrate to be vapor deposited.

EMBODIMENT FOR CARRYING OUT THE INVENTION

Figure 1A:
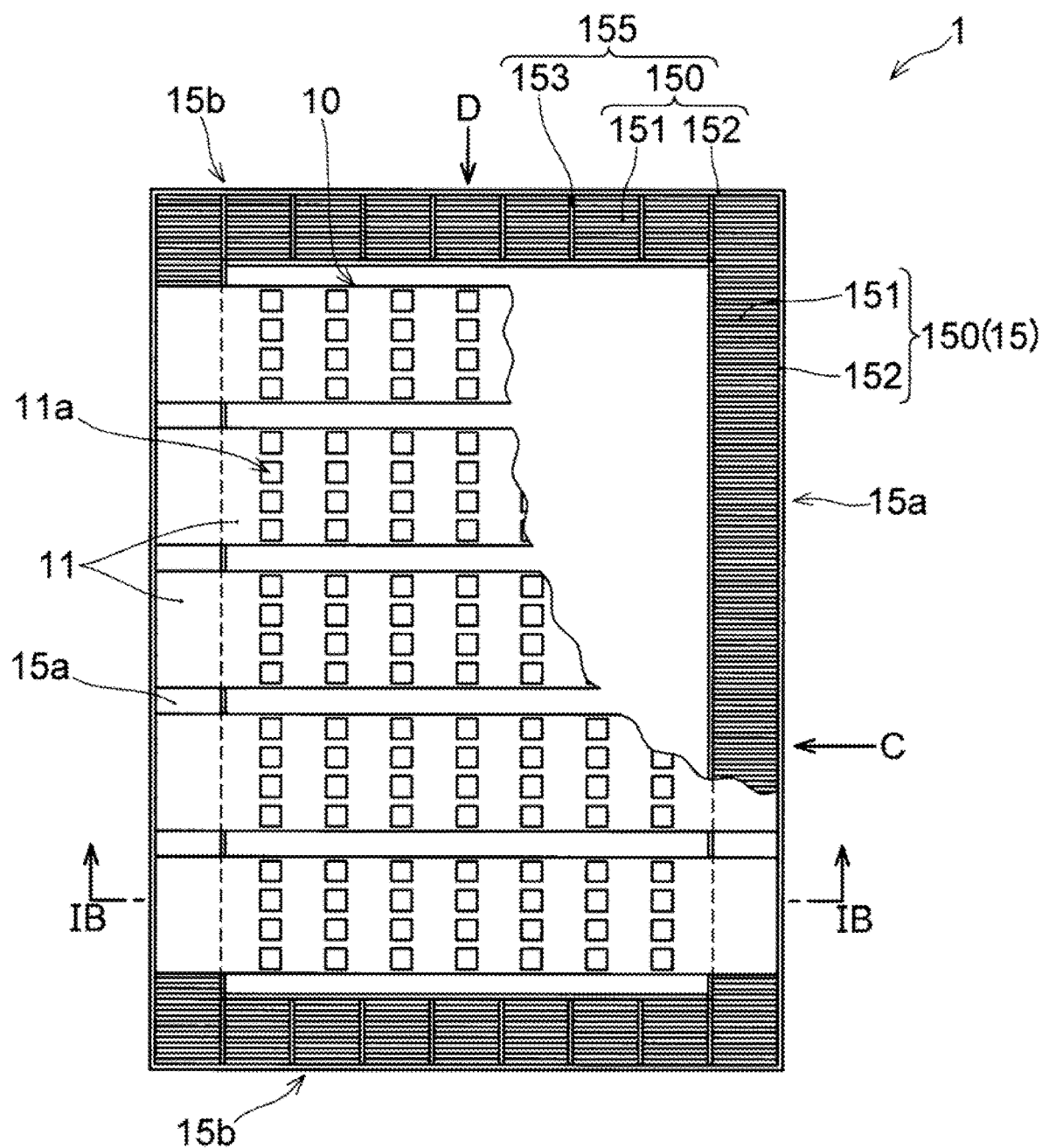
FIG. 1A shows a schematic upper surface of a vapor deposition mask according to one embodiment of the present invention.

As a vapor deposition mask according to a first embodiment and a vapor deposition method according to a second embodiment of the present invention are described with reference to the drawings. With a plan view of a vapor deposition mask 1, a cross-sectional view of FIG. 1A taken along a line IB-IB, a portion of a view of FIG. 1A as seen from an arrow C, and a portion of a view of FIG. 1A as seen from an arrow D being respectively shown in FIGS. 1A to 1D, the vapor deposition mask 1 according to the present embodiment comprises a mask body 10 at which an aperture pattern 11a is formed and a frame 15 to which at least a part of a peripheral edge of the mask body 10 is joined to hold the mask body 10 at a certain state. FIG. 1A is shown such that the state of a core portion 151 (the orientation of a through hole (a vacant space 151a)) can be understood by exposing the frame 15 with a part of the mask body 10 being broken, and removing an end plate 152 of the exposed frame 15.

Figure 1B:
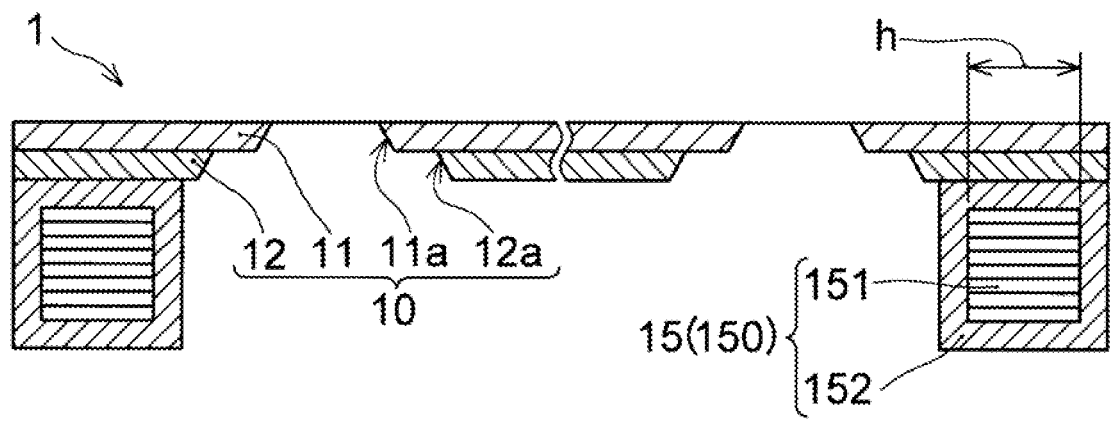
FIG. 1B shows a cross-sectional view taken along a line IB-IB in FIG. 1A.
Figure 1C:
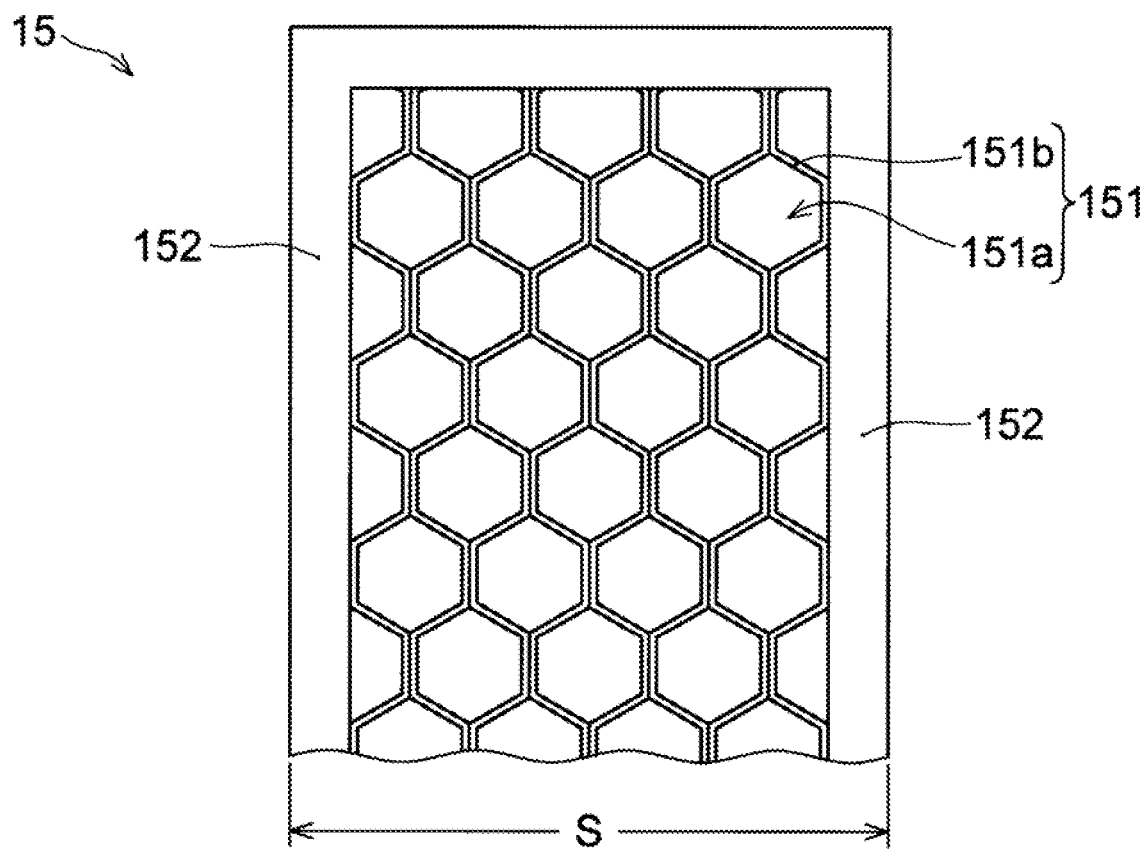
FIG. 1C shows a view as seen from an arrow C in FIG. 1A.
Figure 1D:
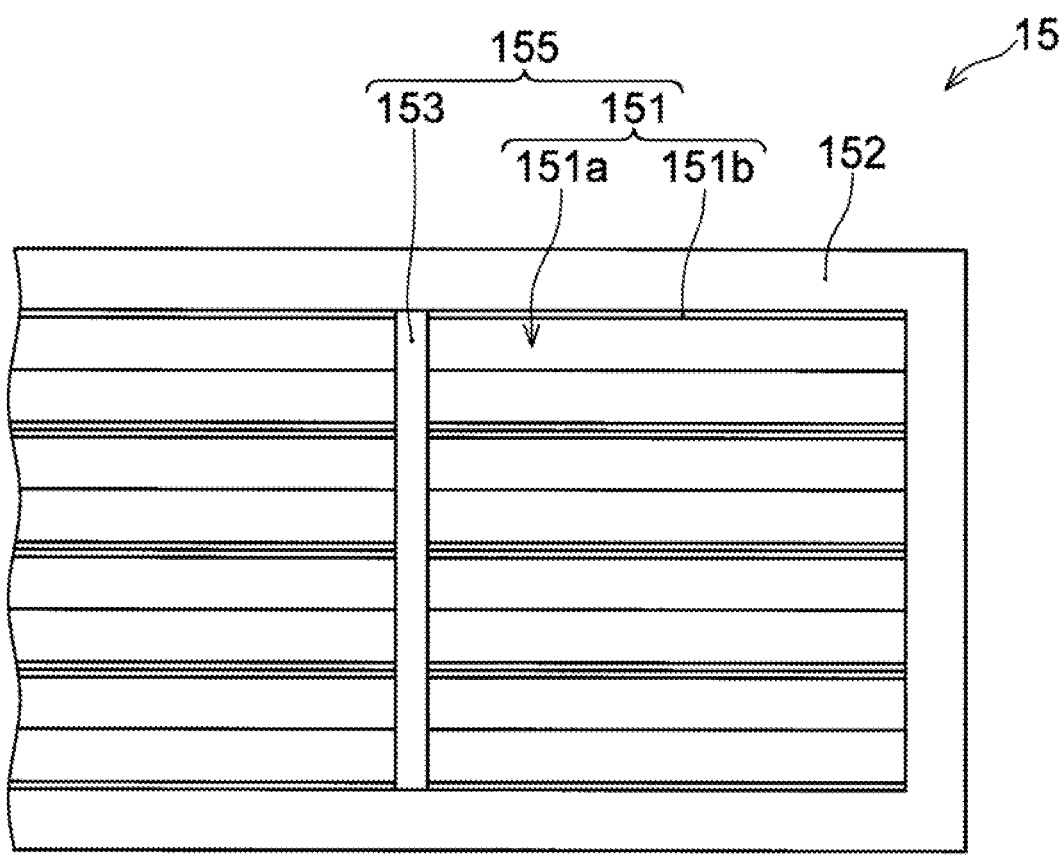
FIG. 1D shows a view as seen from an arrow D in FIG. 1A.

As shown in FIGS. 1C and 1D, at least a part of the frame 15 is formed as a columnar-shaped body being formed by stacking, via a connecting end plate 153, unit structure bodies 155, each of which has a sandwich structure body, that is a basic structure, and in which the end plates 152 are bonded to opposite end surfaces at least a part of the core portion 151 encompassing the vacant space 151a therein. The unit structure body being unrelated to the number of vacant space 151a represents one layer of sandwich structure body 150 including the core portion 151 and the end portions 152 to be stacked via connecting plate 153.

The mask body 10 can be of a hybrid type in which a metal supporting layer 12 comprising an aperture 12a formed so as to not close an aperture pattern 11a of a resin film 11 is attached to the resin film 11, or a metal mask in which a tapered apertured patter is formed with only a metal foil (a thin plate) such as invar, the metal foil having a thickness of approximately 30 micrometer, for example, or a resin film mask comprising only the resin film 11 made of such as polyimide without the metal supporting layer 12 being attached thereto. For a hybrid type mask, the metal supporting layer 12 is joined to the frame 15 as well as the resin film 11.

As described previously, with the conventional vapor deposition mask, there is a problem that the temperature of the substrate 2 to be vapor deposited and the vapor deposition mask 1 at the periphery of the frame 15 (see FIG. 6) tends to rise and that there is a limit to upsizing since the weight of the vapor deposition mask 1 dramatically increases with capsizing. In other words, as described later, at the time of vapor deposition, the vapor deposited material is caused to fly away (evaporate or sublimate) from the vapor deposition source 5 (see FIG. 6) to the vapor deposition mask 1. Therefore, the vapor deposition source 5 is very high in temperature and a portion of the frame 15 that is closest to the vapor deposition source 5 also rises in temperature due to radiative heat. In the vapor deposition mask 1, the temperature of a portion of the metal supporting layer 12 or of the mask body 10 comprising the metal mask also rises, which heat thereof is transmitted to the substrate 2 to be vapor deposited. However, as described previously, the temperature increase in the portion of the frame 15 is larger than the temperature increase in the metal supporting layer 12 of the center portion and the thermal capacity of the frame 15 is large because it has substantial weight. Moreover, while invar, which has a small linear expansion coefficient, has a relatively small thermal conductivity in metals of 13 W/(m·K), the thermal conductivity is one or two orders of magnitude greater than that of acrylic or glass or the like. Therefore, it is considered that heat conduction to the substrate 2 to be vapor deposited by the frame 15 is more substantial than heat transmitted from the center portion of the mask body 10, such as the metal supporting layer 12, to the substrate 2 to be vapor deposited. Moreover, the conventional frame 15 is formed with a solid rod material, so that, once the temperature rises, high temperature is maintained for a long time since the thermal capacity is large. Therefore, when the substrate 2 to be vapor deposited is replaced and vapor deposition onto another substrate 2 to be vapor deposited is carried out, after completion of vapor deposition onto one substrate 2 to be vapor deposited, the temperature of the frame 15 is high from the outset thereof, so that the substrate 2 to be vapor deposited in the vicinity thereof is likely to rise in temperature from the time it is installed. Therefore, there is a problem that the substrate 2 to be vapor deposited has a large thermal expansion at the peripheral edge thereof and is likely to produce misalignment with a center portion.

Moreover, with upsizing of the vapor deposition mask, the weight of the frame 15 of the structure shown in FIG. 1A also becomes problematic. In other words, while the mask body 10 comprising the resin film 11 and the metal supporting layer 12 are joined to the frame 15 as described previously, the mask body 10 is bonded to the frame 15 with tension being applied from the viewpoint of the stability of the shape of the aperture. This tension is, for example, approximately 10N for each sheet of the strip shaped resin film 11 shown in FIG. 1A and approximately several ten millimeters are needed for each of the width and the thickness of the frame 15. To the mask body 10 is applied a tension being greater than that applied to the resin film 11 even in a case that the mask body 10 comprises a metal layer from the viewpoint of preventing a warp or deflection. In a case of the mask body 10 comprising the resin film 11 and the metal supporting layer 12, when the vapor deposition mask 1 of the size of G6H described previously is formed with a rectangular rod material of 50 mm×40 mm, for example, the size of G6H is the size of the substrate and the frame 15 is arranged at the outer periphery thereof, so that the length of each side of the frame 15 is 50 mm larger than the size of G6H. While the frame 15 is rectangular frame shaped, so that the length of only two long sides of a vertical frame 15a can be made to be long to make the short side of a horizontal frame 15b to be the dimension of the substrate size as shown in FIG. 1A, for example, in which case the long side of the vertical frame 15a needs to be made twice as long as the frame width (approximately 100 mm), the result is the same as extending each side by 50 mm.

Thus, the total volume of the frame 15 is 2×(1.550 mm+950 mm)×2000 mm$^2$=10000 cm$^3$. As described previously, the linear expansion coefficient of the material of this frame 15 is preferably close to that of the substrate 2 to be vapor deposited (see FIG. 6), and glass, or polyimide whose linear expansion coefficient is close to that of glass, is used as the substrate 2 to be vapor deposited, invar is generally used for the frame 15 or the metal supporting layer 12 of the vapor deposition mask 1. The relative density of invar is approximately 8, so that the weight thereof is approximately 80 kg. It is aimed that the frame 15 be further upsized relative to G6H, so that it is necessary to make each side of the frame 15 longer, but also to make the width and the thickness of the frame 15 greater, so that the weight thereof becomes greater than the above-mentioned weight. As a result, conveyance thereof by a robot arm becomes impossible.

As a result of having made intensive studies, the present inventor has found that the frame 15 can be made to be a sandwich structure having vacant space, even though the same material as that used conventionally is used, to maintain the mechanical strength while keeping the linear expansion coefficient the same, allowing a substantial weight reduction to be made. The inventor has found that no problem occurs even when tension is applied to the mask body 10 to join the mask body 10 to the frame 15 while almost not impairing the mechanical strength by making the vacant space a honeycomb structure, in particular. Moreover, the inventor has found that, even by using a CFRP (carbon fiber reinforced plastic), the linear expansion coefficient can be made to be approximately the same as that for the conventional invar, the mechanical strength such as rigidity can also be increased, and the specific gravity can be decreased to approximately ¼ to ⅕ of invar. The frame 15 can be made to be the above-mentioned sandwich structure body using the above-mentioned material to further reduce the weight thereof to not more than ¼ of using the CFRP, making it possible to eventually reduce the weight to approximately ¹⁄₂₀ of that of solid invar and to also sufficiently obtain the mechanical strength.

Here, the carbon fiber reinforced plastic (CFRP) being a composite material of a reinforcing fiber such as a carbon fiber, and a plastic (resin) allows demonstrating the features of the material of the carbon fiber which has of being strong, light, and slim. The carbon fiber represents a broadly-defined carbon fiber comprising various fiber materials such as those having a high-strength carbon fiber, a high-rigidity carbon fiber, a glass fiber, or silicon carbide (SiC) as a reinforcing fiber, in addition to the narrowly-defined normal carbon fiber. The type of above-mentioned reinforcing fiber (such as carbon fiber, SiC) can be changed to adjust values of tensile strength, tensile modulus, bending strength, bending modulus, as well as linear expansion coefficients and thermal conductivity, and SiCFRP having silicon carbide as the reinforcing fiber, among others, has a linear expansion coefficient being close to that of polyimide, so that it is suitable as a mask frame.

As described below, a sandwich structure body in which the above-mentioned vacant space 151a (see FIG. 1C) is formed is not only very strong to a stress applied in the axial direction of the vacant space (through hole) 151a, but also strong to a stress in a direction perpendicular to the axial direction. However, resistance to the stress in the direction perpendicular to the axial direction is less than resistance to the stress in the axial direction. On the other hand, as shown in FIG. 1A, the strip shaped mask body 10 is bonded to the vertical frame 15a by welding with tension being applied, causing the vertical frame 15a to be strongly pulled in the direction within the rectangular shaped frame 15. Therefore, in the vertical frame 15a is preferably formed the through hole 151a in the direction from the interior to the exterior of the frame 15.

On the other hand, as the horizontal frame 15b is also sandwiched by the two vertical frames 15a, the horizontal frame 15b is desirably strong to a stress in a direction perpendicular to the two vertical frames 15a. However, as even the horizontal frame 15b has the length of approximately at least 900 mm, creating a sandwich structure body having the through hole 151a of the above-mentioned length in itself is difficult, and, even in a case that it is created, the buckling strength decreases, making it not possible to endure the compression force by the two vertical frames 15a. Thus, as a result of having made intensive studies, the present inventor has found that the unit structure bodies 155 having a sandwich structure with the height of approximately from 10 mm to 100 mm, for example, and, preferably, approximately from 30 mm to 80 mm are formed and the above-mentioned unit structure bodies 155 are stacked via the connecting end plate 153, making it possible to form a very rigid columnar-shaped body. While the connecting end plate 153 can be the same as the end plate 152 of the sandwich structure body 150, it is preferable that a metal plate having the thickness being approximately from 2 mm to 10 mm which is less than the end plate 152 or a plate material comprising the previously-described CFRP can be used.

In a case that the sandwich structure body 150 is formed as a honeycomb structure, for example, the unit structure body 155 does not mean a part of the honeycomb structure of one hole, but a unit layer of the sandwich structure body to be stacked. Thus, as shown in FIG. 2B, for example, in a case that the sandwich structure body being formed in a planar shape is stacked while the through holes 151a are formed in a plurality in the planar shape, the one layer thereof represents the unit sandwich structure, so that, in a case that the above-mentioned sandwich structure body stacked is cut to be formed in a columnar shape, the one layer of sandwich structure body being a portion corresponding to the cross section of the above-mentioned columnar shape represents a unit structure body.

Figure 2A:
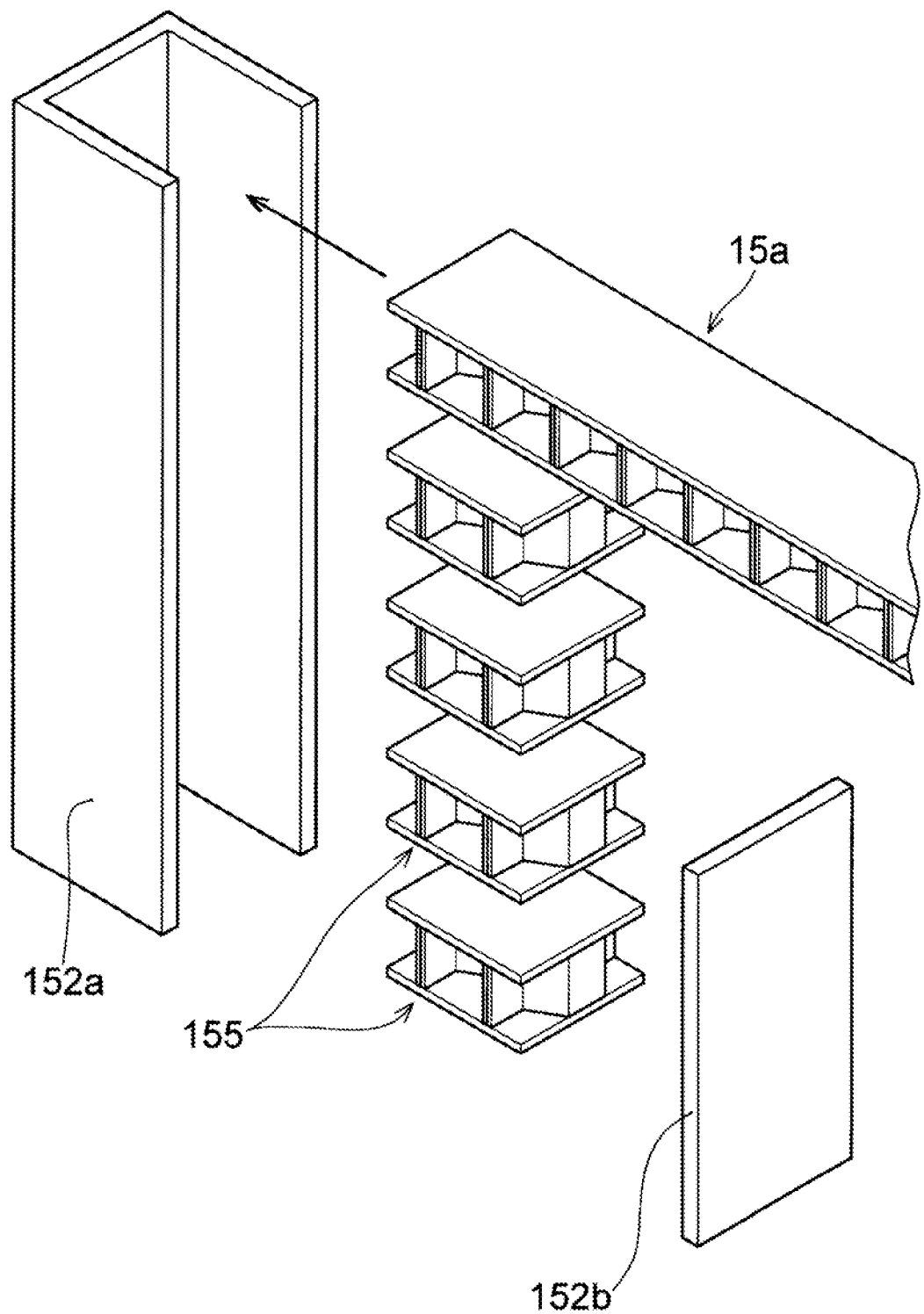
FIG. 2A shows an example of making a columnar-shaped frame from unit structure bodies, each having a sandwich structure.

In other words, the horizontal frame 15b shown in FIG. 1A is formed by the sandwich structure body 150 being formed in a columnar shape by stacking such unit structure bodies 155. As a method for forming such a stacked body, as shown in FIG. 2A, for example, the stacked body can be formed in a structure such that unit structure bodies 155 of a sandwich structure are overlapped to insert the unit structure bodies overlapped into a first end plate 152a being formed in a box shape in which one surface thereof is removed from a hollow square tube and a shape of which cross section is U shaped and, thereafter, the U shaped aperture surface is lid by a second end plate 152b.

In this case, the unit structure bodies 155 can be joined to each other, or can be overlapped onto each other without joining to each other and both end surfaces of a stacked structure can be joined by the end plate 152 without a gap therebetween. While a variation is likely to occur in the entire dimensions (a length of arranged unit structure body) depending on the thickness of the joining material such as an adhesive or a brazing filler material when they are joined to each other, such a problem does not occur in a case that they are merely overlapped onto each other, making it possible to obtain a columnar-shaped body having accurate dimensions. In a case that they are joined to each other, with respect to the connecting end plate 153, one sheet of connecting end plate 153 can be formed between neighboring unit structure bodies 155, not forming it in each unit structure body 155.

Figure 2B:
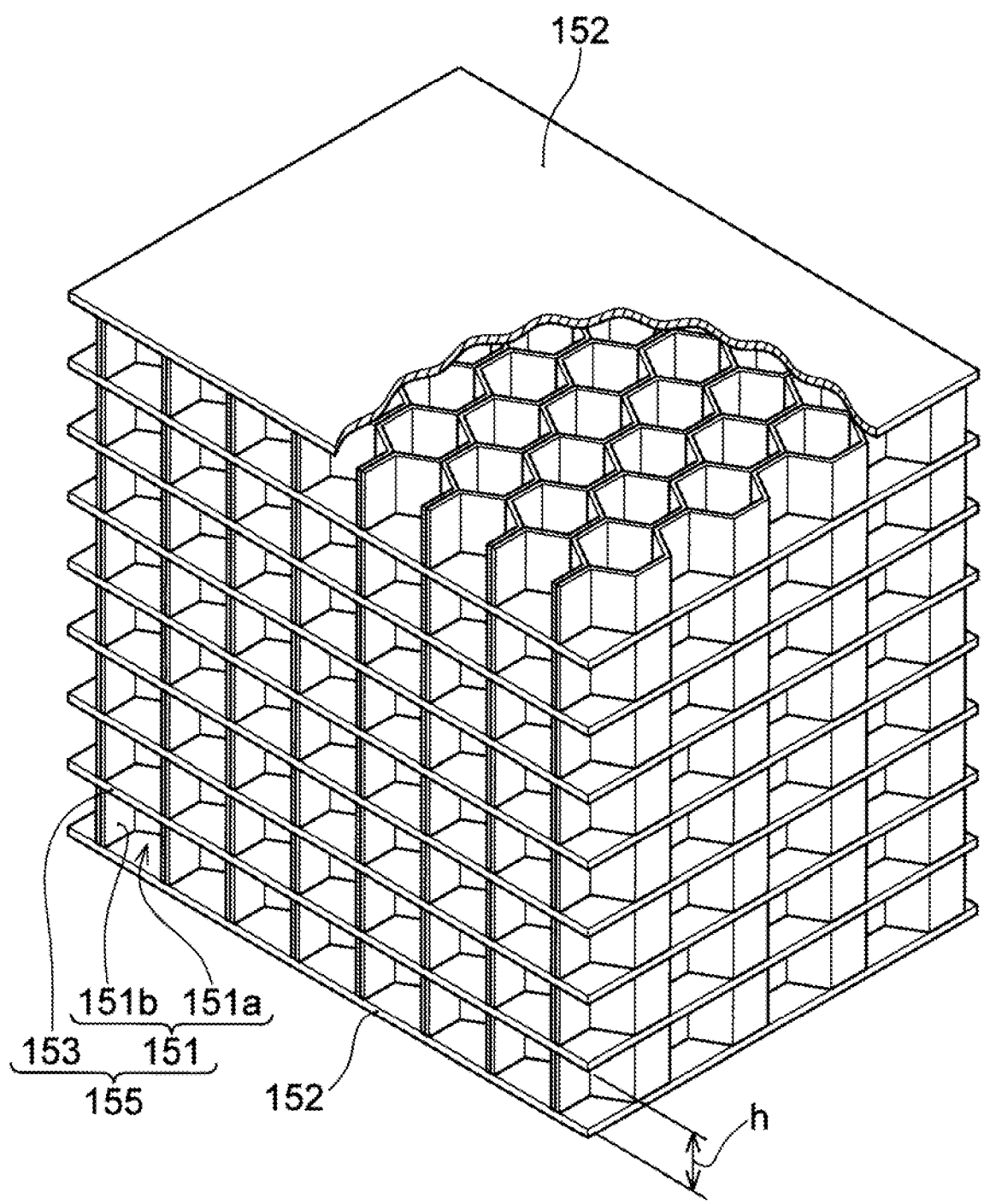
FIG. 2B shows an example of making a deposited body of unit structure bodies, each having the sandwich structure.

Moreover, as shown in FIG. 2B, a plurality of layers of honeycomb structure body (the sandwich structure body 150 without the one end plate (connecting end plate) 152) can be overlapped and bonded to each other using an adhesive to be formed in a columnar shape by cutting them into a required width. Even in this case, the sandwich structure bodies 150 having the end plate 152 on both surfaces can also be stacked as the unit structure bodies 155. In this case, after cutting the sandwich structure bodies 150 into a size of a desired columnar-shaped cross section, they can be overlapped onto each other and joined only at the end face of the surrounding thereof by welding.

Figure 2C:
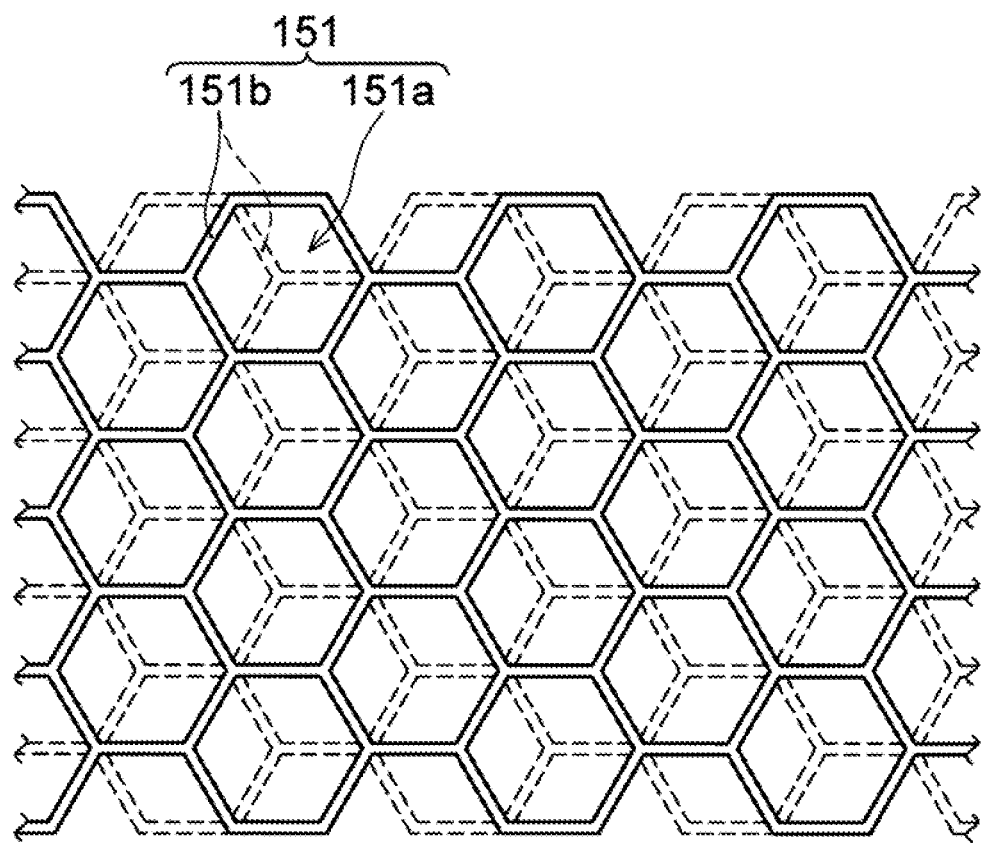
FIG. 2C shows another example of the stacked body in FIG. 2B.

While the example in FIG. 2B shows that the plurality of layers of honeycomb structure are stacked such that the positions of the through hole 151a of the honeycomb structure match, as shown with a plan view in FIG. 2C, for example, with the positions of the through hole 151a being translated in parallel by an amount corresponding to half a cell between the first layer and the second layer of honeycomb structure, the first layer and the second layer of honeycomb structure can also be overlapped onto each other such that the point of joining (the aggregating point of a thin wall portion 151b) of the second layer (the upper layer or the lower layer of the first layer) of honeycomb structure falls at a position being the center of the through hole in the first layer. Such a stacked structure body makes it possible to further increase the strength to a stress applied in the direction vertical to the above-mentioned surface and also further increase the strength to a stress from the horizontal direction.

Figure 3A:
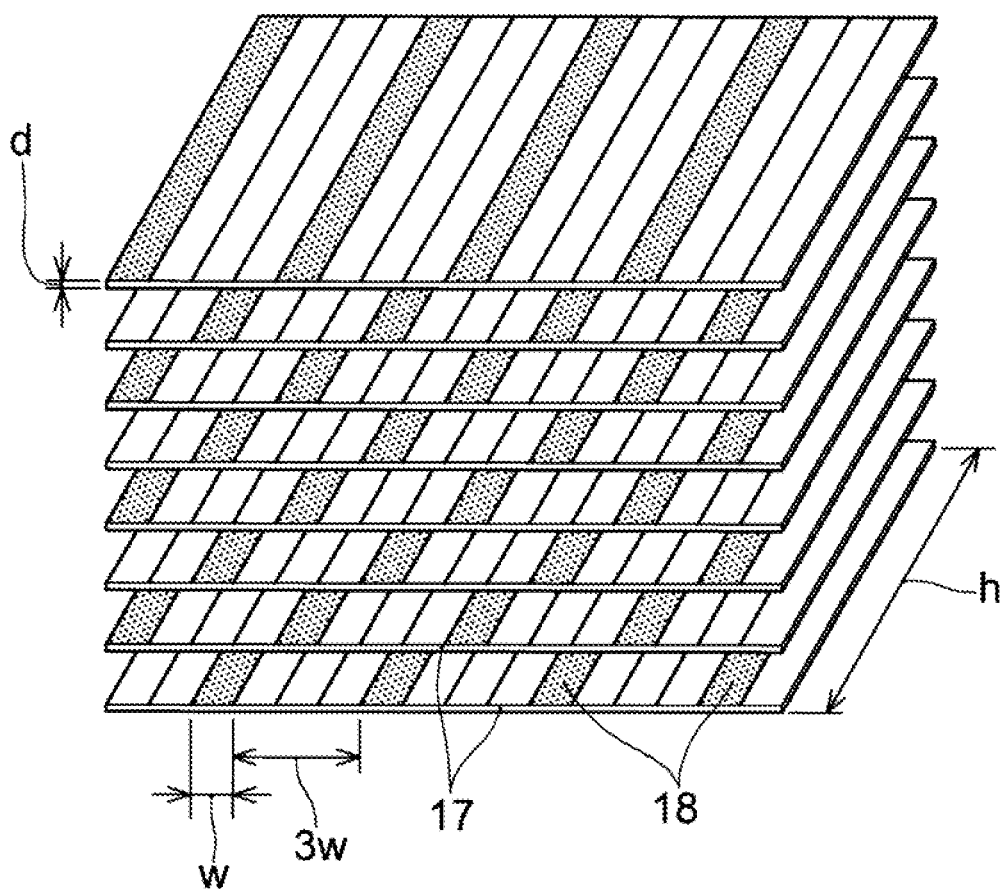
FIG. 3A shows an exemplary manufacturing process of manufacturing a honeycomb structure body.
Figure 3B:
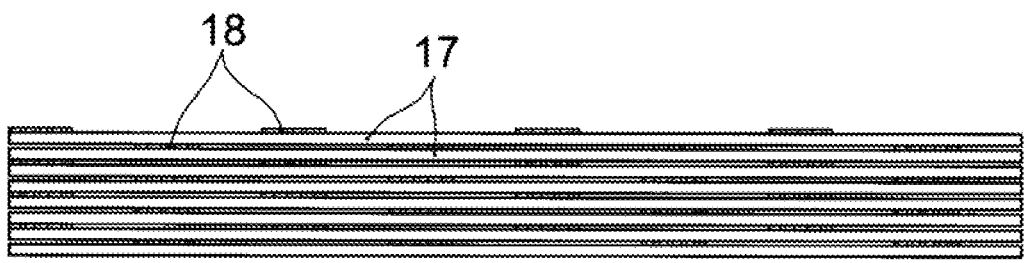
FIG. 3B shows an exemplary manufacturing process of manufacturing the honeycomb structure body.

An exemplary process of manufacturing such one layer of sandwich structure body 150 having a honeycomb structure is explained. The core portion 151 of the sandwich structure body 150 having the honeycomb structure can be formed from sheets of plate shaped body 17, as shown in FIGS. 3A to 3D, for example. In other words, as shown in FIG. 3A, a first sheet having adhesive layers 18, each of which has a width w of approximately from 2.5 mm to 5 mm, is formed with an interval of 3w formed of invar plate (plate shaped body 17) with a thickness d of approximately 0.5 mm and a width h (corresponding to the height of one layer shown in FIG. 2B, or a height h (see FIG. 1B) of the core portion 151 of the honeycomb structure body of the vertical frame 15a in FIG. 1A) of approximately from 20 mm to 50 mm, and a second sheet having adhesive layers 18, each of which has a width w from the end position of one of adhesive layers 18 of the first sheet with an interval of 3w, is formed by the plate shaped body 17. Then, a third sheet having adhesive layers 18, each of which has a width w from the end position of one of adhesive layers 18 of the second sheet with an interval of 3w, is similarly formed by the plate shaped body 17. Similarly, a fourth sheet formed of plate shaped body 17 having adhesive layers 18, each of which has a width w from the end position of one of adhesive layers 18 of the third sheet with an interval of 3w, is formed. On the fifth sheet of plate shaped body 17, adhesive layers 18 are formed such that they are located at the same position as that on the first sheet of plate shaped body 17. On the sixth sheet and thereafter of plate shaped body 17, adhesive layers 18 are similarly formed. After a required number of sheets of plate shaped body 17 are formed, the sheets of plated shaped body 17 are overlapped and adhered to each other FIG. 3B). As an adhesive, a polyimide-based adhesive, for example, can be used. Alternatively, soldering using a silver solder can also be used.

Figure 3C:
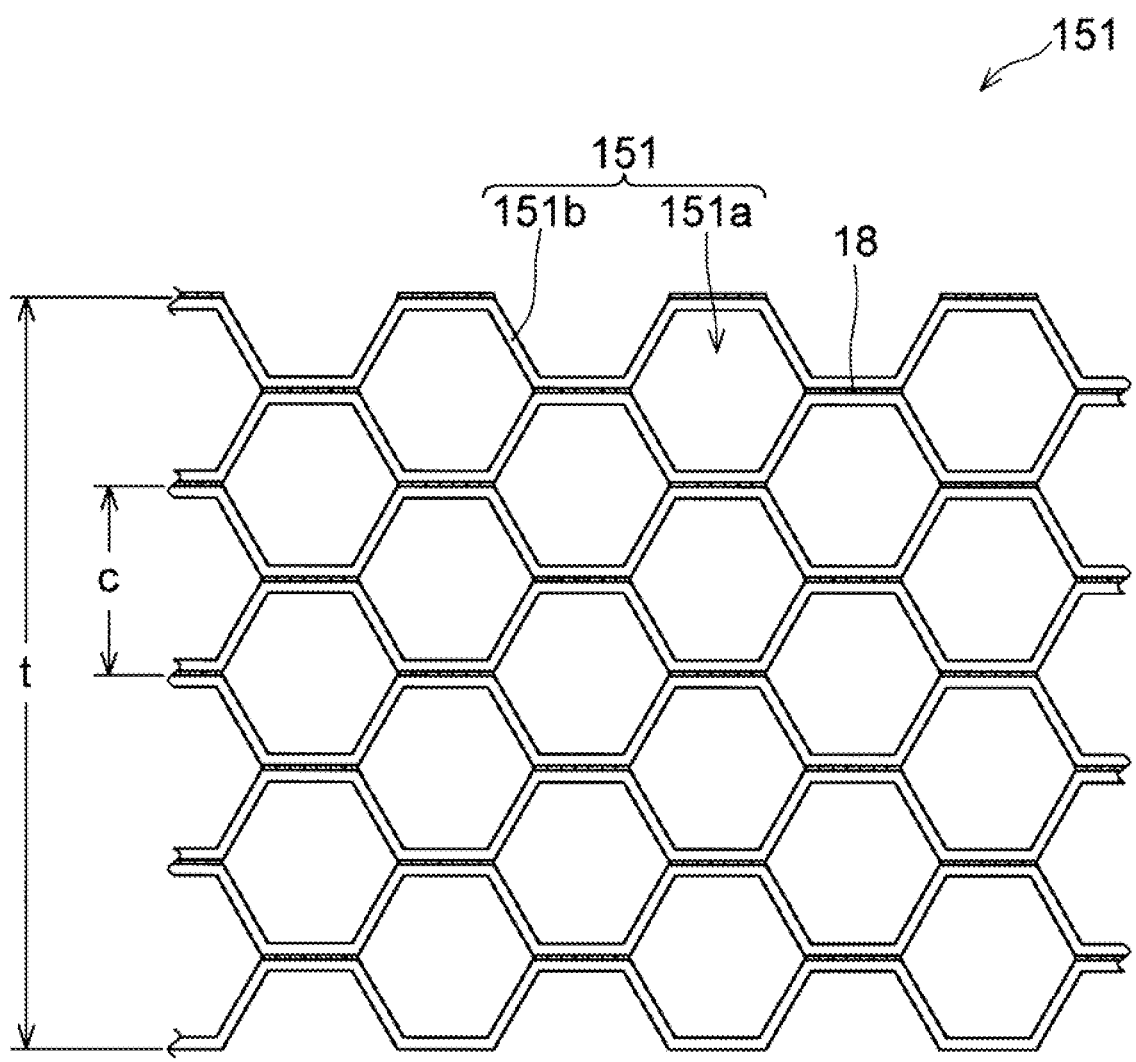
FIG. 3C shows an exemplary manufacturing process of manufacturing the honeycomb structure body.
Figure 3D:
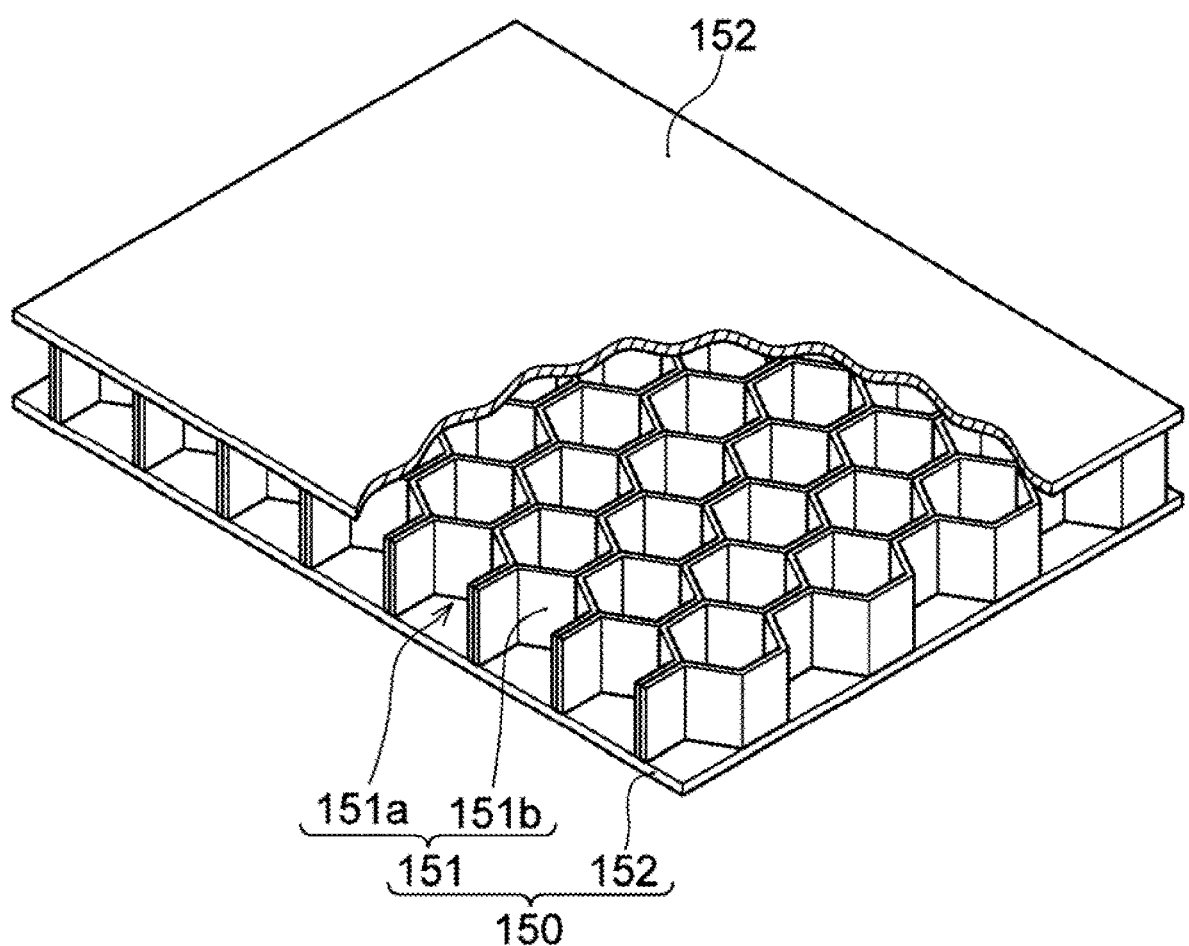
FIG. 3D shows a perspective diagram of a core portion in FIG. 3C.

Thereafter, as shown in FIG. 3C, holding and drawing out the lowermost and uppermost sheets of plate shaped body 17 cause the surrounding portion of each part adhered with the adhesive layer 18 to be deformed to form an approximately 120° angle with the part adhered, forming the core portion 151 comprising the vacant space 151a and the thin walled portion 151b with a wall thickness of 2d for the part adhered and a wall thickness of d for the other part. In this example, the cell size c is formed to be approximately 5 mm to 10 mm. A perspective diagram for this state is shown in FIG. 3D. A columnar-shaped body with a quadrilateral having a length (a width of the frame 15) s (see FIG. 1C) in which a width t of the core portion of FIG. 3C and twice a thickness of the end plate 152 described later are added and having the previously-described height of h as a cross section is formed. The width s and the height h are each formed to approximately several ten millimeters and the length is set in accordance with the size of the vapor deposition mask 1. However, it is construed that the above be merely exemplary, so that these dimensions can be set arbitrarily in accordance with setting of the through hole in any orientation of the frame 15.

It is construed that the thickness d of the plate shaped body 17 used in the previous example be also not limited thereto, so that it can be selected to a thickness which can tolerate the necessary load. For example, a plate thickness d can be increased to enable the plate shaped body 17 to resist a large load. In this case, if the plate gets too thick, it becomes more difficult for the plate shaped body to be deformed when the upper and lower surfaces of the plate shaped body are drawn out and stretched, so that a groove which makes it easier for the plate shaped body to be bent can be formed on a portion at which the plate shaped body is to be bent.

The sandwich structure body 150 comprising a honeycomb structure has the features that it is strong with respect to in-plane/out-of-plane shear load and out-of-plane compression load and that it has a high out-of-plane rigidity (a high buckling strength). It is made so that stress is applied in the maximum-strength direction, so that advantages (i.e., lightweight and highly rigid) of the honeycomb structure are utilized. Using the thickness d shown in FIG. 3A and the cell size shown in FIG. 3C, the higher the value of 2d/c, the higher the rigidity, so that, when the rigidity is to be increased, the plate thickness d can be increased and the cell size c can be decreased to easily obtain a desired rigidity.

While the core portion 151 thus formed can be utilized as a highly rigid member as it is, in a case that it is used with the above-mentioned one layer, as shown in FIG. 1C, the periphery thereof can be surrounded by the end plate 152 to make the sandwich structure body 150 to further increase the rigidity. For the end plate 152, an invar plate having a thickness of approximately 3 mm is used, for example. In FIG. 1C, for ease of understanding of the internal structure, the end plate 152 that closes the vacant space (through hole) 151a is not shown. While the end plate 152 can be bonded for each surface of a quadrangular prism, as shown in the previously-described FIG. 2A, it is made stronger with respect to rigidity in all directions by bending one or two plate materials such that they surround the four sides of the core portion 151. The use as a frame 15 of the vapor deposition mask 1 is also preferable from a point of view of not only rigidity, but also from a point of view of suppression of an organic material penetrating into the vacant space 151a. This point is also the same for a case in which the previously-described unit structure bodies 155 are stacked to form a columnar-shaped body. In other words, this is because, at the time of vapor deposition, the organic material floats in a vacuum chamber and is also likely to seep into the vacant space 151a. Moreover, with respect to the vapor deposition mask 1, when a certain number of vapor depositions are carried out, it is necessary to remove the organic material attached to the vapor deposition mask 1, so that the vapor deposition mask 1 is cleaned periodically. At the time of this cleaning, the cleaning agent can also get into the vacant space 151a and can remain in the vacant space 151a even after cleaning. Vapor deposition is carried out with this vapor deposition mask 1 being installed within the vacuum chamber, so that, if the cleaning agent remains in the vacant space at the time of making the chamber vacuum, the remained cleaning agent is caused to be an impurities contaminating source (a gas generating source), making it not possible to carry out normal vapor deposition.

Therefore, it is preferable that this vacant space 151a be sealed hermetically with the end plate 152. Irregularities are present not only on an aperture surface of the vacant space (through hole) 151a, but also on the side surface (a side surface which is parallel with the through hole 152), it is preferable for the same reason that the end plate 152 be bonded thereon. This end plate 152 can be bonded using an adhesive or soldering, the adhesive being the same as adhesive material when forming the core portion 151 of the previously-described honeycomb structure. While a firm connection can be made at a portion at which the end plate 152 can adhere onto a portion of a surface of the core portion 151 in the upper and lower surfaces shown in FIG. 3C, a contact area between the core portion 151 and the end plate 152 is small in the aperture surface of the vacant space 151a and left and right surfaces in FIG. 3C, so that sufficient adhesive or soldering is needed. However, as described previously, instead of the end plate 152 being separately bonded to each side surface, one metal plate is bent and bonded, causing an increased strength against stress and an increased strength of adhering onto the core portion 151. As a result, as described previously, it is preferable that all of six sides of the quadrangular prism be surrounded by the end plate 152.

Figure 3E:
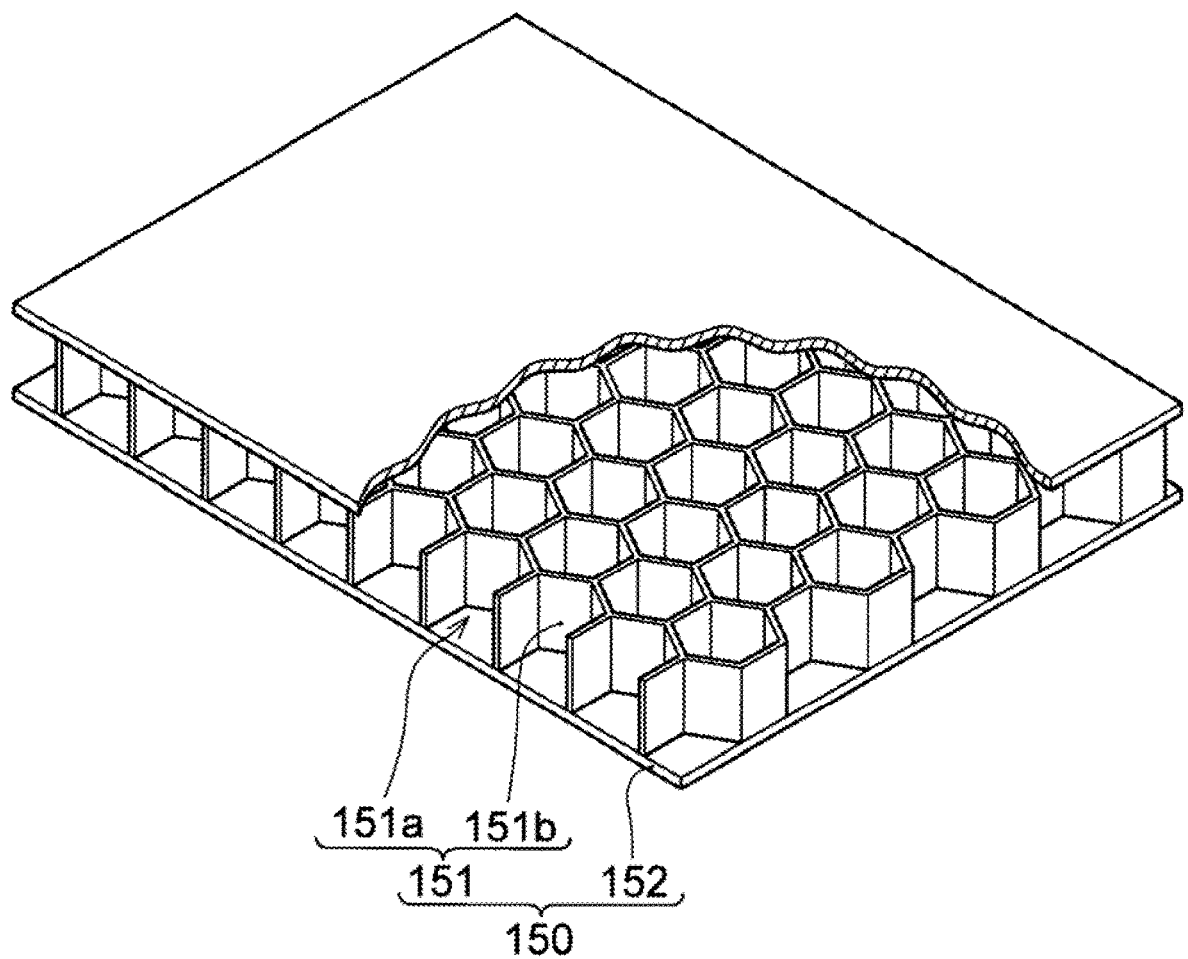
FIG. 3E shows a perspective diagram of the core portion in FIG. 3C in a case that it is formed of a CFRP material.

While the above-mentioned example is an example in which the core portion 151 is formed from the plate shaped body 17, forming of the core portion 151 is not construed to be limited to the above-mentioned example. For example, the core portion 151 can be manufactured also by forming a through hole in a solid metal material, for example, or can also be formed by die molding. In particular, the previously-described CFRP is difficult to be deformed, so that it is formed by injection molding. According to the above-mentioned method, as there is no need to bond the plates shaped bodies 17 together in the above-mentioned method, adhering two sheets of thin walled portion 151b causes a portion to reach the thickness of 2d to be eliminated, providing a constant wall thickness. The above-mentioned example is shown in FIG. 3E. FIG. 2C is shown for brevity, so that the above-mentioned thin wall portion 151b is shown with an example of constant thickness.

Figure 3F:
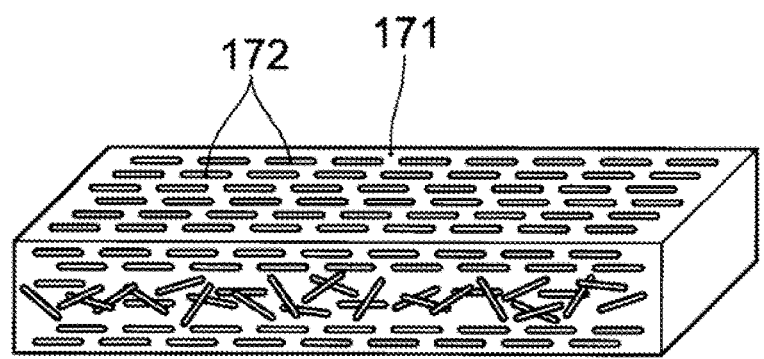
FIG. 3F shows a diagram explaining anisotropy in a case that the CFRP material is manufactured by injection molding.

While the CFRP is formed mainly by injection molding, as it has anisotropy, it differs in mechanical strength depending on the direction, amount, or position of carbon fiber, so that the mechanical strength in a particular direction can be increased. In other words, as shown in FIG. 3F, in general, a molten resin flows within a die in an injection molded product, and the orientation of a filler 172 in a resin 171 is aligned in a specific direction, so that a high mechanical strength is obtained in the above-mentioned direction. Therefore, the direction in which a stress is applied, in particular, is made to be the above-mentioned direction. In this case, injection molding being carried out such that the previously-described carbon fiber fillers are aligned in the direction of the through hole 151a causes the buckling stress to further increase. In a case of manufacturing a stacked body using CFRP, the connecting end plate 153 can also be formed using CFRP, and CFRP can also be used for the end plate 152 to be formed in a sandwich structure, making it possible to carry out welding by providing a metal coating using non-electrolytic plating, electrolytic plating, or vacuum deposition or sputtering.

While an example of a narrowly-defined honeycomb structure being a regular hexagon is explained in the previously-described example, the shape of the vacant space 151a is not necessarily limited to the regular hexagon, so that, while the honeycomb structure is to be somewhat weaker to a lateral stress, it can be a hexagon having a collapsed shape, a polygon other than hexagon, or, in an extreme case, a circle. In a case of the circle, a circular hole having a small radius can be inscribed in a region surrounded by four circles to similarly form a thin wall portion 151b having much vacant space 151a and having a thin wall. In the present specification, a broadly-defined honeycomb structure such as these structures is referred to as a honeycomb structure. Moreover, in the present embodiment, a frame 15 being lightweight and having a large mechanical strength is similarly formed by directing the orientation of a corrugated structure shown in FIGS. 4A and 4B such that the axial direction (Y-axis direction) of the through hole (vacant space) 161a is oriented to the direction in which a stress is applied.

Figure 4A:
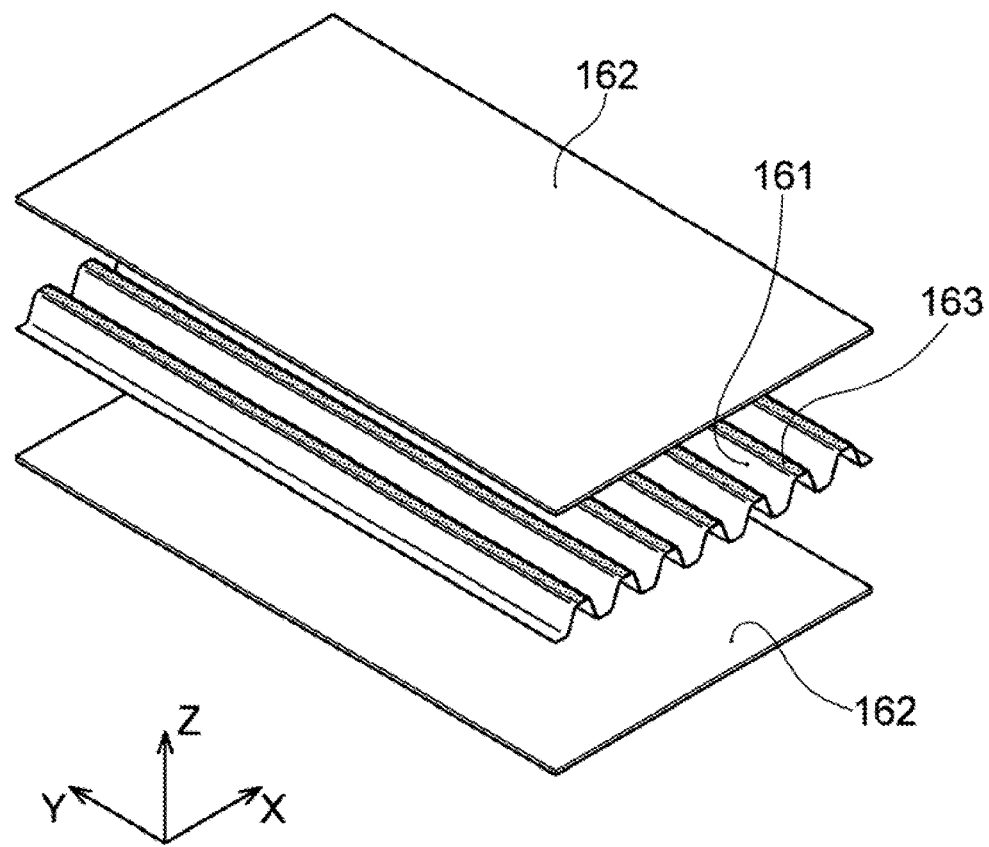
FIG. 4A shows another exemplary structure of the sandwich structure body.
Figure 4B:
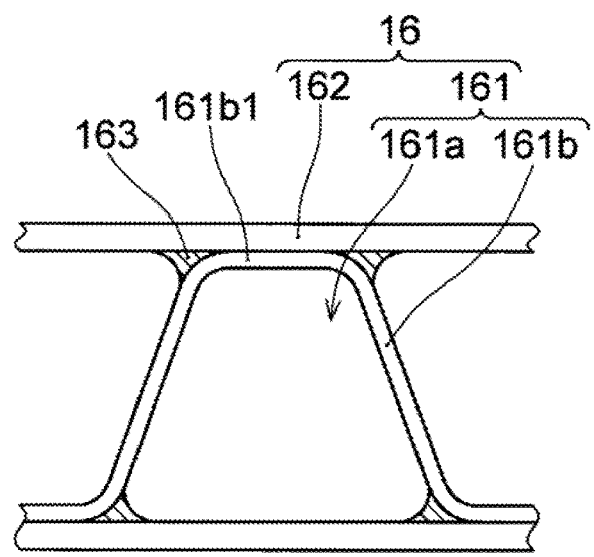
FIG. 4B shows an enlarged view of a connection portion between a core and end plates in FIG. 4A.

In the structure shown in FIG. 4A, the core portion 161 is formed together with the vacant space 161a by folding a plate shaped body into a wave shape to form a wave plate 161b and bonding the end plates 162 at the exterior of the peak and valley thereof to form the sandwich structure body 16. While the above-mentioned structure is somewhat weak against a force in the left and right horizontal directions in FIG. 4A (X-axis directions in FIG. 4A), it is strong against a stress in the axial directions (Y-axis directions in FIG. 4A) and strong to some degree against a stress in the Z-axis directions. In this case, as shown in FIG. 4B, the wave plate 161b and the end plate 162 are firmly adhered to each other to obtain a great mechanical strength. Therefore, it is preferable that a peak and valley portion 161b1 of the wave form of the wave plate 161b be planarized to some extent and joined to the end plates 162 by an adhesive 163 or a brazing filler material. While the example shown in FIG. 4A shows the end plates 162 being provided on only upper and lower surfaces thereof, it is preferable that the surrounding of the lateral surfaces be also covered with the end plate 162.

(Structure of Vapor Deposition Mask)

Figure 5:
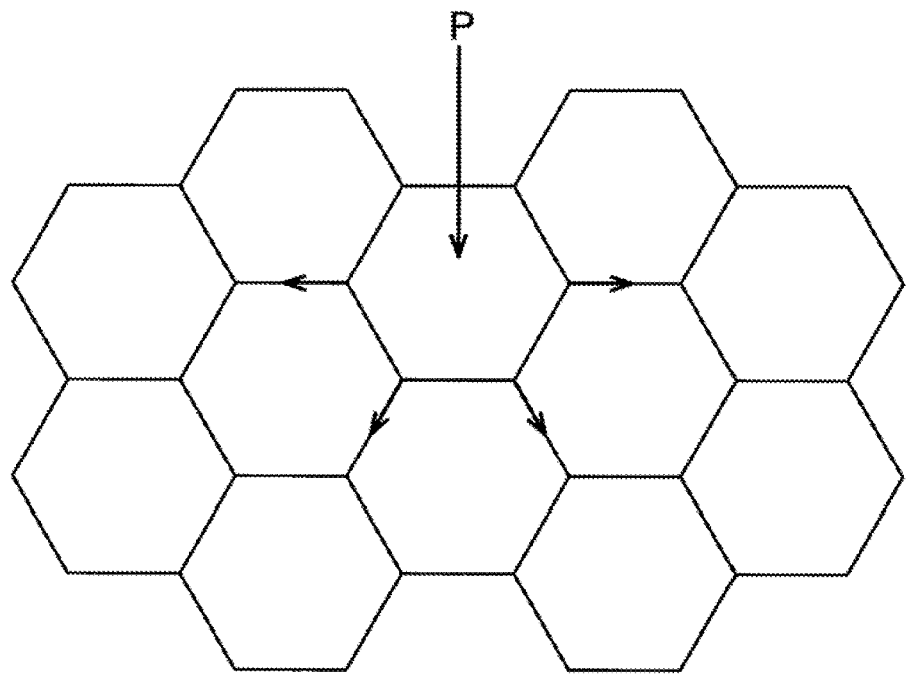
FIG. 5 shows a diagram explaining a reason that a honeycomb structure is strong even against a force in the horizontal direction.

The vapor deposition mask 1 according to the present embodiment is characterized by the structure of the frame 15 to hold the mask body 10. More specifically, as shown in FIG. 1C with the end plate 152 being removed from the view as seen from the arrow C in FIG. 1A and as shown in FIG. 1D with the end plate 152 being removed from the view as seen from the arrow D in FIG. 1A, the frame 15 has a through hole (a vacant space) 151a formed and the through hole 151a is formed to have a hexagonal shape. The through hole 151a is formed in such a hexagonally-shaped honeycomb structure, so that it is very strong against not only stress in an axial direction of the through hole 151a, but also against stress in a direction perpendicular to the aperture surface of the through hole 151a. The reason is that, as shown in a schematic diagram of the honeycomb structure in FIG. 5, for example, when a stress P in the horizontal direction is applied against the through hole 151a, stress is uniformly shared among each side of the hexagonal. Thus, the through hole 151a is very strong even with respect to the stress P in the horizontal direction and a strength per unit mass is 4 to times the strength of a solid material. Conversely, the weight thereof can be reduced to approximately ⅙ to ¼ to maintain the same stress.

However, the present embodiment is characterized in that the unit structure bodies 155 of the sandwich structure are stacked such that they do not buckle even when they turn into a long rod shape (columnar shape) while the direction in which a strong stress is applied is made to be the axial direction that can endure the stress most, not the horizontal direction of the honeycomb structure. As shown in FIG. 1A, the vertical frame 15a is bonded with the mask body 10 with tension being applied thereto, the sandwich structure body 150 in which the through hole 151a is formed in the direction outward from the interior of the rectangular shape of frame 15 such that it reacts against the tension is used.

On the other hand, the mask body 10 is not bonded to the horizontal frame 15b, so that no direct stress is applied to the horizontal frame 15b. In even this case, for the horizontal frame 15b, a structure is envisaged that has a through hole in the direction outward from the interior of the rectangular shape of frame 15 in the same manner as the vertical frame 15a such that, because it is envisaged that in a case of providing a vertical type vapor deposition apparatus (in a case that the vertical frame 15a is made to be parallel to the vertical direction), it is needed to endure the self-weight thereof. However, the vertical frame 15a is pulled by the mask body 10, so that, eventually, the two vertical frames 15a are pulled by each other. As a result, the horizontal frame 15b needs to endure the compression force by the two vertical frames 15a. Therefore, a columnar-shaped frame comprising the previously-described stacked body of the unit structure bodies is used for the horizontal frame 15b. The use of such a stacked body of the unit structure bodies 155 with a large rigidity causes the stress applied in the axial direction of the columnar-shaped body in which the unit structure bodies 155 are stacked to be once reset by the connecting end plate 153 and not accumulated. As a result, the buckling strength can also be improved substantially.

Moreover, with such a structure, in a case of providing the vertical type vapor deposition apparatus, by placing the vertical frame 15a against the vertical-type vapor deposition apparatus such that it is horizontally long, the structure of the frame 15 is to be such that both the vertical frame 15a and the horizontal frame 15b are to be a structure being strong to a stress against a force in the gravity direction, so that it is also to be firm against the vertical type vapor deposition apparatus. In this case, as the vertical frame 15a (the longer frame) is placed against the vertical type vapor deposition apparatus such that it is horizontally long, the area occupied by the vapor deposition apparatus is to be somewhat greater than that in a case that the vertical frame 15a is placed vertically, but, with differences therebetween being only 900 mm and 1500 mm with G6H, for example, the differences being not so significant, there is an advantage that it is easier to carry out tasks stably with the horizontally long placement of the vertical frame 15a than with the vertically long placement thereof. Compared to the area occupied by the horizontal type vapor deposition apparatus (the apparatus in which the vapor deposition mask and the substrate to be vapor deposited are placed in parallel to the horizontal plane), the area of occupied by the vapor deposition apparatus is substantially reduced, and, in manufacturing the organic EL display apparatus in particular, vapor deposition is carried out while moving the substrate 2 to be vapor deposited with a number of vacuum chambers being lined up, so that the effect of reducing the area occupied by the vapor deposition apparatus is very large.

By forming the sandwich structure body 150 having such a vacant space 151a, even when the material is the same as that of the conventional frame 15, the weight can be reduced to approximately ⅙ to ¼ and also the volume of the part of the thin wall portion 151b is reduced, causing the thermal capacity to be also reduced. Even more, using the same material, physical constants such as the linear expansion coefficient and the thermal conductivity do not change. Rather, the presence of the vacant space (through hole 151a) makes the heat conduction to be substantially reduced.

Therefore, a columnar-shaped sandwich structure body 150a is used as the vertical frame 15a at the long side of the vapor-deposition mask 1, the columnar-shaped sandwich structure body being formed such that the through hole 151a orients to the outward from the interior of the rectangular-shaped frame 15, and all of the through halls of a plurality of the unit structure bodies is aligned in parallel, and a columnar-shaped sandwich structure body 150a is used as the horizontal frame 15b at the short side of the vapor-deposition mask 1, the columnar-shaped sandwich structure body being formed such that the previously-described unit structure bodies 155 of the sandwich structure are stacked so as to align the through halls along the axis of the columnar-shaped sandwich structure body. Then, two pairs of the vertical frames 15a and the horizontal frames 15b are prepared according to the length of each side of the frame 15 and joined at the end portions to form the rectangular-shaped frame 15. Conventionally, the long side frame and the short side frame are joined with bolts and nuts or the like, however, in the present embodiment, since there are much vacant space, and twisting generate easily, so sufficient fixation is required so as to not make occur twisting or the like. Therefore, it is preferable to assemble by attaching a splint or the like to the corners of the frame-shaped quadrilateral, and tightening with nuts and bolts penetrating the sandwich structure body 150. The corners are sufficiently joined to prevent twisting.

There are various methods to bond the mask body 10 to the frame 15. For example, the mask body 10 is pulled along the horizontal frame 15b at the short side of the rectangular shaped frame 15 and joined to the vertical frame 15a at the long side of the rectangular shaped frame 15 by welding. While only five sheets of the strip shaped mask body 10 are shown in the example shown in FIG. 1A, there are also examples such that, in actuality, approximately 12 sheets, for example, are successively bonded, in which case, a stress of approximately 10N for each sheet is applied, so that, as a whole, a stress of approximately 120N is applied. Therefore, as described previously, the vertical frame 15a and the horizontal frame 15b are formed. As described previously, while the mask body 10 comprises a mask comprising solely a metal, a mask comprising solely a resin film, and a hybrid type mask using both, the mask body 10 comprising only the resin film can be directly adhered using an adhesive. In this case, an adhesive which does not generate gas at the time of vapor deposition is used. For example, as the adhesive, a fully curing adhesive such as an epoxy resin being thermosetting, or a polyimide-based resin is preferable.

When welding this strip shaped mask body 10 to the frame 15, joining a long end portion formed at the mask body 10 to the lateral surface of the frame 15 (an outer peripheral wall being a lateral surface opposite to the interior of the rectangular shape of the frame 15) further makes it strong against stress due to tension. In this case, welding is carried at the lateral surface of the frame 15. In particular, there is a great advantageous effect when bonding is carried out with an adhesive, when the mask body 10 comprising only the resin film.

While the vacant space 151a is preferably closed by the end plate 152 as described previously, it is more preferable that the interior of the vacant space 151a be brought to negative pressure (be depressurized) by bonding the end plate 152 under reduced pressure at the time of closing the vacant space 151a. This is because, as the vapor deposition mask 1 is used in a vacuum evaporation apparatus as described previously, air trapped within the vacant space 151a in the vacuum chamber can leak in case the vacant space 151a is sealed at an atmospheric pressure, thus causing the degree of vacuum within the vacuum chamber to be reduced. Moreover, the interior of the vacant space 151a being brought to negative pressure also reduces heat conduction, and, moreover, heat conduction in the frame 15 heated by the vapor deposition source 5 (see FIG. 6) can further be suppressed.

From the point of view of suppressing heat conduction, a rare gas such as argon can be sealed into the vacant space 151*a* to further suppress heat conduction. This is because the rare gas has a low thermal conductivity. To seal with the rare gas or depressurize within the vacant space 151*a* as such, the core portion 151 and the end plates 152 can be joined under the depressurized atmosphere and/or under the rare gas atmosphere.

The sandwich structure body 150 comprising such a vacant space 151*a* is particularly strong against load in the direction parallel to the axis of the vacant space 151*a*. On the other hand, as described previously, as the vapor deposition mask 1 is necessary to firmly stabilizes the aperture 11*a* of the resin film 11, the mask body 10 (see FIG. 1B) comprising the resin film 11 and the metal supporting layer 12 is joined to the frame 15 such that it is pulled to apply tension (see FIG. 1B).

As shown with a cross-sectional view of the example of the hybrid type mask in FIG. 1B, the mask body 10 of the vapor deposition mask 1 comprises the resin film 11, and the metal supporting layer 12, for which a magnetic material is used. As the metal supporting layer 12, Fe, Co, Ni, Mn, or an alloy thereof, for example, can be used. Among them, invar (an alloy of Fe and Ni) is particularly preferable since the difference in the linear expansion rate relative to the substrate 2 to be vapor deposited is small and there is almost no expansion due to heat. The thickness of the metal supporting layer 12 is formed to approximately from 5 μm to 30 μm.

Figure 6:
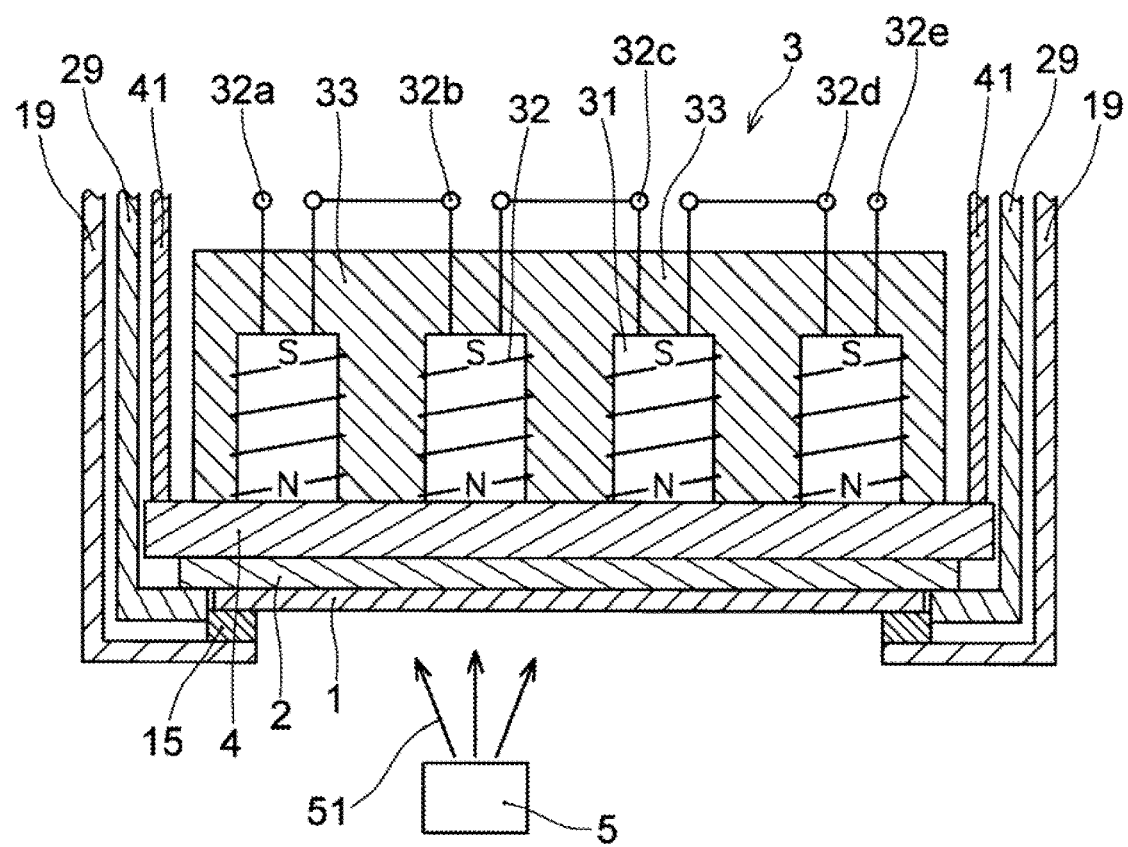
FIG. 6 schematically shows a lateral view of a vapor deposition apparatus.

In FIG. 1B, the aperture 11*a* of the resin film 11 and the aperture 12*a* of the metal supporting layer 12 are formed in a tapered shape so as to be smaller toward the substrate 2 to be vapor deposited (see FIG. 6). The reason is to prevent them, when the vapor deposition material 51 (see FIG. 6) is vapor deposited, from becoming shadows of the vapor deposition material 51 flown away. The mask body 10 is not construed to be limited to the hybrid type mask, so that it can be a metal mask, or a mask comprising only a resin film.

When the mask body 10 is a metal mask, an aperture pattern is formed using an invar sheet whose thickness is approximately 30 μm, for example. Adjusting conditions of etching processing, the aperture pattern is formed in a tapered shape which becomes smaller toward the substrate to be vapor deposited in a manner similar to that of the resin mask. As shown in FIG. 1A, for example, such a mask body can be bonded in a plurality of sheets in a strip shape, or can be bonded as one sheet. This metal mask is also bonded to the frame by welding with tension being applied to the metal mask. While the metal mask is harder than the resin film and likely to warp or deflect, so that it is necessary to apply more tension to the metal mask than to the resin mask, the frame according to the present embodiment is very strong, so the advantageous effect is greater when the frame according to the present embodiment is used for the metal mask than for the mask using the resin film.

Such a mask body 10 can be bonded to the frame 15 to obtain a vapor deposition mask 1. While the vapor deposition mask 1 has a structure that the metal supporting layer 12 is attached to the resin film 11, it can be without the metal supporting layer 12. In a case that there is no metal supporting layer 12, a further stability of the resin film 11 is required, so that the mask body 10 needs to be fixed to a sturdy, strong frame 15. While the frame 15 is likely to be heavy as a result, the frame 15 can be made to be the sandwich structure body 150 comprising the vacant space 151*a* to prevent the weight from increasing. In a case that the metal supporting layer 12 is not provided, a magnetic body can be used for the frame 15 of the vapor deposition mask 1 to allow attraction with a magnet.

The frame 15 of the vapor deposition mask 1 can be made to be a sandwich structure body 150 comprising such a vacant space 151*a* to greatly reduce the weight. In other words, while the frame 15 is made to be a honeycomb structure having a structure shown in the previously-described FIG. 3D to reduce the weight of the vapor deposition mask 1 of G4.5 to approximately ⅙ to ¼ of a conventional solid case, there is no problem with stress due to bonding of the mask body 10. As a result, the vapor deposition mask 1 having a weight approximately 3 to 4 times the above, or in other words, having a size of approximately G8 (approximately 2200 mm×2400 mm) can sufficiently be conveyed with a robot arm. Even when conveying the vapor deposition mask 1 with the robot arm becomes possible, space is necessary with a horizontal type vapor deposition apparatus, and a very large space is necessary since, particularly in manufacturing an organic EL display apparatus, approximately 6 to 10 vacuum chambers are lined up to carry out vapor deposition while successively replacing the substrate 2 to be vapor deposited. Therefore, it is preferable to use a vertical type vapor deposition apparatus (the vapor deposition mask 1 and the substrate 2 to be vapor deposited are positioned upright to cause the vapor deposition material to be flown away from the horizontal direction) to reduce the ground area of factories.

Moreover, in the vapor deposition mask according to the present embodiment, the frame 15 comprises much vacant space 151*a*. Therefore, heat conductance is substantially suppressed. In other words, the vapor deposition source 5 faces a surface of the frame 15 that is opposite to a surface on which the mask body 10 is bonded, and so that the temperature of the surface facing to the vapor deposition source 5 is likely to rise. However, much vacant space 151*a* formed can cause heat conduction to be suppressed substantially. Air or depressurized air or rare gas can further reduce heat conduction, making it possible to suppress a temperature increase of the mask body 10 or the substrate 2 to be vapor deposited. As a result, this makes an occurrence of the temperature distribution of the vapor deposition mask 1 and the substrate 2 to be vapor deposited unlikely. This makes it possible for a higher definition organic layer pattern to be formed.

According to the vapor deposition mask 1 of the present embodiment, a substantial reduction in the weight of the frame 15 causes the thermal capacity to be reduced. Therefore, while the temperature is likely to rise, it is conversely likely to fall. In other words, even when the substrate 2 to be vapor deposited in a large number is successively vapor deposited onto with an organic material, replacing the substrate 2 to be vapor deposited, an immediate heating upon the following substrate 2 to be vapor deposited being arranged by accumulating of heat in the vapor deposition mask 1 does not occur. As a result, a stable vapor deposition can be repeated.

(Schematic Configuration of Vapor Deposition Apparatus)

As shown in FIG. 6, in a vapor deposition apparatus using a vapor deposition mask 1 according to one embodiment of the present invention, a mask holder 19 and a substrate holder 29 are provided to be moveable upward or downward such that the vapor deposition mask 1 and the substrate 2 to be vapor deposited are arranged in proximity in the interior of a vacuum chamber. This substrate holder 29 holds a peripheral edge portion of the substrate 2 to be vapor deposited with a plurality of hook shaped arms and connected to a drive device (not shown) such that it can rise upward or fall downward. When replacing the substrate 2 to be vapor deposited, the substrate 2 to be vapor deposited carried into the vacuum chamber with the robot arm is received with a hook shaped arm and the substrate holder 29 falls until the substrate 2 to be vapor deposited comes very close to the vapor deposition mask 1. An imaging device (not shown) is also provided to carry out alignment. A touch plate 4 is supported by a support frame 41 and is connected via the support frame 41 to a drive device which cause the touch plate 4 to fall until it comes into contact with the substrate 2 to be vapor deposited. The touch plate 4 being made to fall causes the substrate 2 to be vapor deposited to be planar.

The vapor deposition apparatus also comprises a micromotion device which relatively moves the substrate 2 to be vapor deposited with respect to the vapor deposition mask 1, for alignment between the vapor deposition mask 1 and the substrate 2 to be vapor deposited, while imaging an alignment mark formed on each of the vapor deposition mask 1 and the substrate 2 to be vapor deposited. Alignment is carried out while stopping supplying power to the electromagnet 3 so that the vapor deposition mask 1 is not unnecessarily attracted by the electromagnet 3. Thereafter, the electromagnet 3 being held by a similar holder (not shown) or the touch plate 4 to be lowered to cause current to flow causes the vapor deposition mask 1 to be attracted toward the substrate 2 to be vapor deposited.

According to the present embodiment, a structure in which the core portion 151 of the sandwich structure body 150 comprising a vacant space is sandwiched by the end plates 152 is used for the frame 15 of the vapor deposition mask 1, so that loading or unloading of the vapor deposition mask 1 with a robot arm (not shown) can be easily carried out since it is lightweight.

With respect to the electromagnet 3, a plurality of unit electromagnets, in each of which a coil 32 is wound to a core 31, is fixed to a coating material 33 comprising a resin. In the example shown in FIG. 6, with respect to the plurality of unit electromagnets, terminals 32a to 32e of the coil 32 of each unit electromagnet are connected in series. However, it is construed that the configuration of the electromagnet 3 be not limited to this example, so that it can be made to various configurations. The shape of the core 31 can be a quadrilateral or a circle. For example, when the size of the vapor deposition mask 1 is approximately G6 (1500 mm×1800 mm), a unit electromagnet comprising the core 31 with the size of the cross section of the unit electromagnet shown in FIG. 1 of approximately 50 mm square can be arranged such that a plurality of unit electromagnets are lined up in accordance with the size of the vapor deposition mask 1 as shown in FIG. 6. (In FIG. 6, the horizontal direction is reduced in scale and the number of electromagnets is drawn to be less). In the example shown in FIG. 6, the coil 32 is connected in series. However, the coil 32 of each unit electromagnet can be connected in parallel. Moreover, a unit of a few pieces can be connected in series. Current can be independently applied to some of the unit electromagnets.

As shown in the previously-described FIG. 1B, the vapor deposition mask 1 comprises the resin film 11 and the metal supporting layer 12, and the frame 15 formed in the surrounding thereof and, as shown in FIG. 6, with respect to the vapor deposition mask 1, the frame 15 is placed on the mask holder 19. A magnetic material is used for the metal supporting layer 12 and/or the frame 15 to cause attracting force to act with the core 31 of the electromagnet 3 and cause the substrate 2 to be vapor deposited to be attracted thereto with the substrate 2 to be vapor deposited placed between the metal supporting layer 12 and/or the frame 15, and the core 31 of the electromagnet 3.

Various vapor deposition sources 5 such as point shaped, linear shaped, or surface shaped ones can be used. A linear shaped vapor deposition source 5 (extending in a direction perpendicular to the paper surface in FIG. 6) which crucibles are linearly lined up, for example, is scanned from the left end to the right end of the paper surface to cause vapor deposition to be carried out on the entire surface of the substrate 2 to be vapor deposited. Therefore, the apertures 11a and 12a are formed in a tapered shape to make the vapor deposition material 51 reach to the substrate 2 to be vapor deposited without blocking it, even when the vapor deposition material 51 arriving from a slanted direction by the vapor deposition material 51 being flown away to various directions.

(Vapor Deposition Method)

A vapor deposition method according to a second embodiment of the present invention is described. The vapor deposition method according to the second embodiment of the present invention comprises arranging a substrate 2 to be vapor deposited and a vapor deposition mask 1 shown in FIG. 1B, for example, such that they overlap with each other as shown in FIG. 6; and causing a vapor deposition material to fly away from a vapor deposition source 5 arranged to be positioned apart from the vapor deposition mask 1 to be deposited on the substrate 2 to be vapor deposited. In other words, the vapor deposition method according to the second embodiment of the present invention features in that a frame of a vapor deposition mask is formed by a sandwich structure body 150 comprising a core portion 151 in which a vacant space 151a and a thin walled portion 151b are formed as in honeycomb structure, and end plates 152 to cover at least a part of opposite end surfaces of the core portion.

Moreover, as described previously, the substrate 2 to be vapor deposited is overlapped on the vapor deposition mask 1. Alignment of this substrate 2 to be vapor deposited and the vapor deposition mask 1 is carried out as follows: the alignment is carried out by moving the substrate 2 to be vapor deposited relative to the vapor deposition mask 1 while observing, with an imaging device, an alignment mark for alignment that is formed on each of the substrate 2 to be vapor deposited and the vapor deposition mask 1. In this way, an aperture 11a of the vapor deposition mask 1 can be made to correspond with a location to be vapor deposited of the substrate 2 to be vapor deposited (for example, the pattern of a first electrode 22 of a supporting substrate 21 for a below-described organic EL display apparatus). The electromagnet 3 is operated after the alignment is carried out. As a result, a strong attraction force acts between the electromagnet 3 and the vapor deposition mask 1, causing the substrate 2 to be vapor deposited to firmly approach the vapor deposition mask 1.

Thereafter, as shown in FIG. 6, flying away (vaporization or sublimation) of the vapor deposition material 51 from the vapor deposition source 5 to be positioned apart from the vapor deposition mask 1 causes the vapor deposition material 51 to be deposited onto the substrate 2 to be vapor deposited. More specifically, while a linear source in which crucibles are arranged such that they are lined up linearly can be used, it is construed to be not limited thereto.

According to the present embodiment, the vapor deposition mask 1 is lightweight, making it very easy to install the vapor deposition mask 1 into a vacuum chamber. Moreover, the vapor deposition mask 1 being lightweight makes carrying with a robot arm easy, making it possible to carry out further upsizing of the vapor deposition mask 1. In other words, mass production is possible, making it possible to achieve a cost reduction. Moreover, the vacant space 151a of the frame 15 causes heat conduction to be suppressed and also causes the thermal capacity to be reduced, making it possible to suppress the thermal expansion difference between the substrate 2 to be vapor deposited and the vapor deposition mask 1 with heat being accumulated in the vapor deposition mask 1. As a result, this makes it possible to carry out vapor deposition onto a large-sized substrate to be vapor deposited and also carry out high definition vapor deposition.

(Method for Manufacturing an Organic EL Display Apparatus)

A method for manufacturing an organic EL display apparatus using the vapor deposition method according to the above-described embodiment is described. Methods of manufacturing other than the vapor deposition method can be carried out with well-known methods, so that a method of depositing an organic layer using the vapor deposition method of the present invention is mainly described with reference to FIGS. 7A and 7B.

A method for manufacturing an organic EL display apparatus according to a third embodiment of the present invention comprises: forming a TFT (not shown), a planarizing layer, and a first electrode 22 (for example, an anode) on a supporting substrate 21; overlapping the supporting substrate 21 and a vapor deposition mask 1 such that the first electrode 22 is oriented downward and aligning them; and, vapor depositing a vapor deposition material 51, wherein a deposition layer 25 of an organic layer is formed by using the previously-described vapor deposition method. In this way, a second electrode 26 (a cathode, for example) is formed on the deposition layer 25.

Figure 7A:
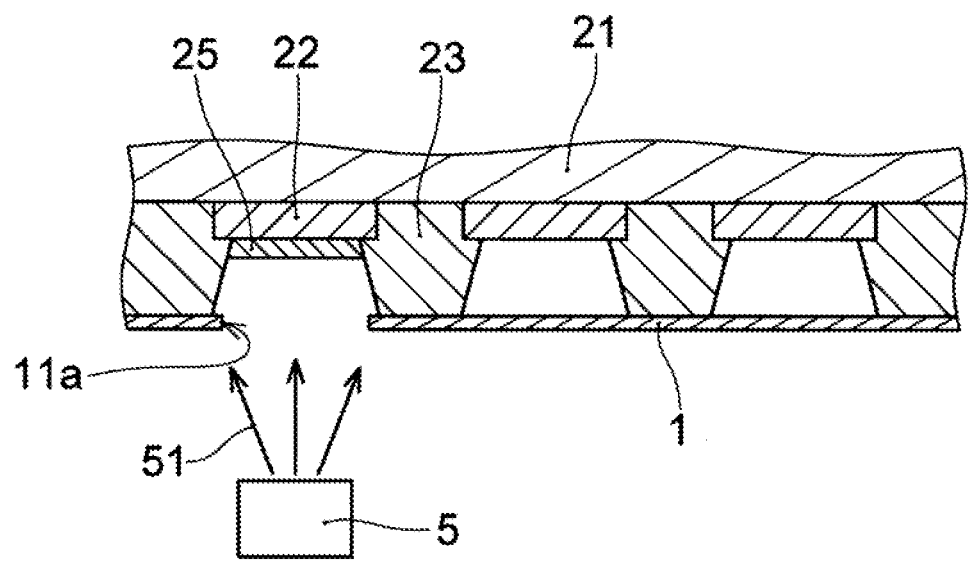
FIG. 7A shows one of vapor deposition processes in a method for manufacturing an organic EL display apparatus according to one embodiment of the present invention.

While the supporting substrate 21 such as a glass plate, for example, is not shown fully, a driving element such as a TFT is formed for a R, G, B sub-pixel of each pixel, and the first electrode 22 that is connected to the driving element is formed on the planarizing layer by a combination of an ITO layer and a layer of metal such as Ag or APC. As shown in FIGS. 7A and 75, an insulation bank 23 comprising a polyimide resin, an acrylic resin, or $SiO_2$ partitioning sub pixels is formed in between the sub pixels. The vapor deposition mask 1 is aligned and fixed on the insulation bank 23 of the supporting substrate 21 as such. As shown in FIG. 6 described previously, this fixing is carried out by attracting using an electromagnet 3 provided via a touch plate 4 on a surface opposite a vapor deposition surface of the supporting substrate 21 (the substrate 2 to be vapor deposited), for example. As described previously, a magnetic body is used for the metal supporting layer 12 (see FIG. 1B) of the vapor deposition mask 1, so that, when a magnetic field is provided by the electromagnet 3, the metal supporting layer 12 of the vapor deposition mask 1 is magnetized to cause an attraction force to be produced with the core 31 of the electromagnet 3. Even when the electromagnet 3 does not comprise the core 31, the metal supporting layer 12 is attracted by a magnetic field produced by current flowing through the coil 32.

In this state, as shown in FIG. 7A, the vapor deposition material 51 flies away from a vapor deposition source (crucible) within a vacuum chamber, the vapor deposition material 51 deposited only on a portion of the supporting substrate 21 that is exposed to an aperture 11a of the vapor deposition mask 1, and the deposition layer 25 of the organic layer is formed on the first electrode 22 of a desired sub pixel. This vapor deposition process can be carried out for each sub pixel with the supporting substrate 21 being transferred, in order, to a different vacuum chamber. The vapor deposition mask 1 with which the same material is simultaneously vapor deposited for a plurality of sub pixels can be used. When the vapor deposition mask 1 is to be replaced, a power supply circuit (not shown) is turned off to cause the magnetic field to the metal supporting layer 12 (see FIG. 1B) of the vapor deposition mask 1 to be removed by the electromagnet 3 (see FIG. 6) not shown in FIG. 7A.

Figure 7B:
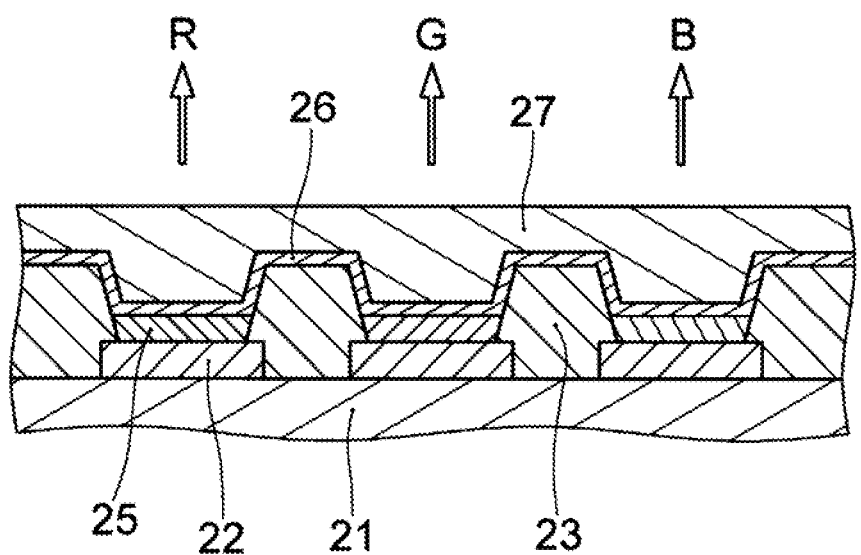
FIG. 7B shows a state in which an organic layer is deposited using the method for manufacturing the organic EL display apparatus according to one embodiment of the present invention.
Figure 8:
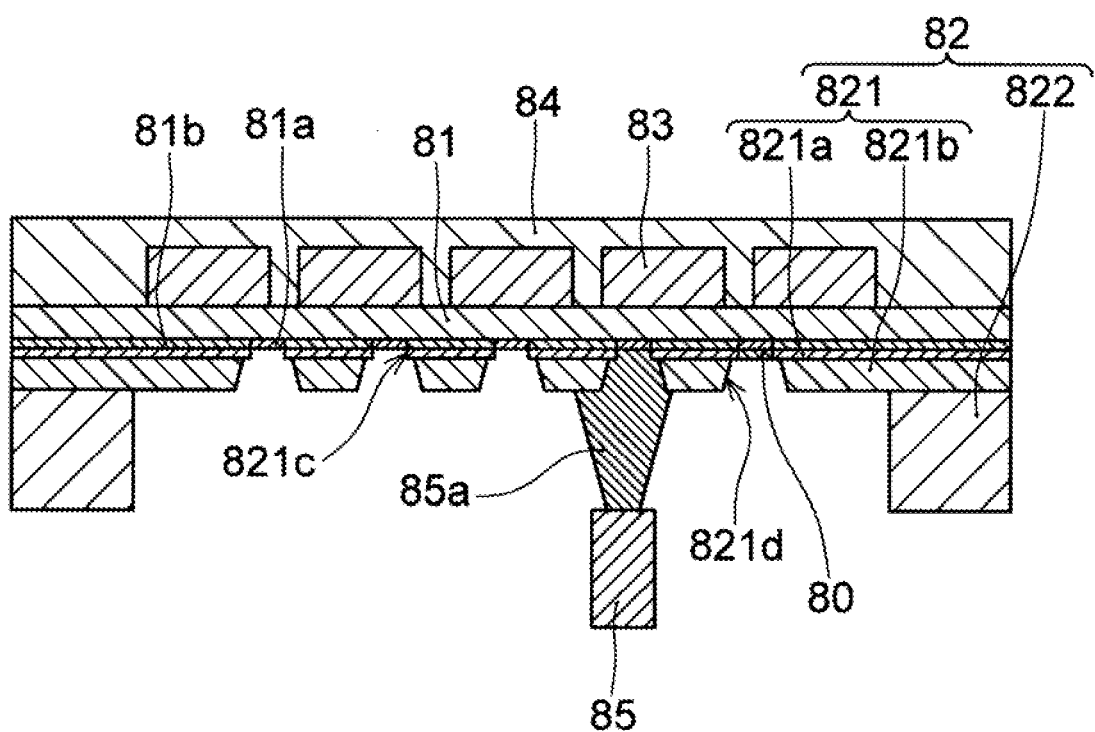
FIG. 8 shows a diagram explaining a conventional case of vapor depositing an organic layer.

While the deposition layer 25 of the organic layer is simply shown as one layer in FIGS. 7A and 7B, the deposition layer 25 of the organic layer can be formed as a plurality of deposition layers 25 that comprise different materials. A positive hole injection layer comprising a material having a good matching ionization energy that improves a positive hole injection property can be provided as a layer in contact with the anode 22, for example. A positive hole transport layer that allows electron entrapment into a light emitting layer (energy barrier) as well as improvement in stable transport of positive holes can be formed on the positive hole injection layer using an amine material, for example. Moreover, a light emitting layer which is selected in accordance with a light emitting wavelength can be formed thereon with an organic fluorescent material of red or green being doped to $Alq_3$ for red or green, for example. Furthermore, as a blue color material, a DSA organic material is used. An electron transport layer which, together with improving the electron injection property, transports electrons stably is formed on the light emitting layer using $Alq_3$. Each of these layers that has a thickness of approximately several ten nm (nano-meters) is deposited to form the organic deposition layer 25. An electron injection layer, formed of LiF or Liq, that improves electron injection property can be provided between this organic deposition layer and a metal electrode. In the present embodiment, the organic deposition layer 25 also comprises the above-described layers.

Of the organic deposition layer 25, with respect to the light emitting layer, an organic layer of a material according to each color of R, G, B is deposited. Moreover, with respect to the positive hole transport layer and the electron transport layer, it is preferable, with an emphasis on the light emitting performance, that a material suitable for the light emitting layer be separately deposited by different materials. However, taking into account the aspect of the cost of materials, the same material common to two or three colors of R, G, B can be deposited. When the material common to sub pixels of two or more colors is deposited, the vapor deposition mask 1 is formed in which the aperture 11a is formed for the common sub pixels. In a case the vapor deposition layer differs for individual sub-pixels, one vapor deposition mask 1 for the R sub-pixel, for example, is used to successively vapor deposit each organic layer. Moreover, when an organic layer common to R, G, B is deposited, vapor deposition of an organic layer for each sub pixel is carried out down to the lower layer of the common layer, and, at the common organic layer, vapor deposition of the organic layer for all pixels is carried out at once using the vapor deposition mask 1 at which the aperture 11a is formed for R, G, B. For mass production, with a number of vacuum chambers of a vapor deposition apparatus being lined up, and a different vapor deposition mask 1 being installed at each of the number of vacuum chambers, vapor deposition can be carried out continuously by moving the supporting substrate 21 (the substrate 2 to be vapor deposited) through each vapor deposition apparatus.

After forming of the deposition layer 25 of each organic layer including the electron injection layer such as the LiF layer is completed, as described above, the electromagnet 3 is turned off, so that the electromagnet 3 is separated from the vapor deposition mask 1. Thereafter, a second electrode (for example, the cathode) 26 is formed on the entire surface. As the example shown in FIG. 7B is for top emission type, in which light is emitted from a surface opposite the supporting substrate 21 shown in FIG. 7B, the second electrode 26 is formed with a light transmitting material such as a thin film Mg—Ag co-crystallized layer, for example. Alternatively, Al can be used. For bottom emission type, in which light is emitted via the supporting substrate 21, ITO or $In_3O_4$ is used for the first electrode 22, and a metal having a small work function, for example, Mg, K, Li, or Al, can be used for the second electrode 26. On a surface of this second electrode 26, a protective film (encapsulating layer) comprising $Si_3N_4$, for example, is formed. The entirety is sealed with a sealing layer such as a moisture-resistant resin film or glass (not shown) and is configured such that the deposition layer 25 of the organic layer is prevented from absorbing moisture. Moreover, the organic layer is made common as much as possible and a structure in which a color filter is provided on a surface thereof can be formed.

(Summary)

(1) A vapor deposition mask according to a first embodiment of the present invention comprises: a mask body at which an aperture pattern is formed; and a frame to which at least a part of a peripheral edge of the mask body is joined to hold the mask body at a certain state, wherein at least a part of the frame is formed by a columnar-shaped body in which unit structure bodies are stacked via a connecting end plate, each of the unit structure bodies comprising a core portion encompassing a vacant space therein and end plates provided on opposite end surfaces of at least a part of the core portion, thereby forming a sandwich structure.

The vapor deposition mask according to the first embodiment of the present invention can endure even a very large stress without buckling since a columnar-shaped body is formed by stacking unit structure bodies of a sandwich structure even in a case that a large stress acts in the axial direction of the frame while the frame of the vapor deposition mask is configured by the sandwich structure body comprising a vacant space. As a result, a short side of the frame that can sufficiently endure the compression force generated by two long sides being bonded with the mask body with tension being applied can be obtained, making it possible to form a light and rigid frame.

(2) The vacant space of each of the unit structure bodies is formed as a plurality of through holes along a certain direction, and the unit structure bodies are stacked such that the through holes are lined up in the same direction. Thereby, a large rigidity to a stress being parallel to the through holes is obtained.

(3) The core portion of the unit structure bodies can be formed using a metal or a carbon fiber reinforced plastic (CFRP). The metal is preferable, since the same material as that for the frame of the conventional vapor deposition mask can be used for the metal, and the weight becomes light, and the carbon fiber reinforced plastic is preferable because the weight for the carbon fiber reinforced plastic is much smaller than that for invar.

(4) The carbon fiber reinforced plastic being a silicon carbide fiber reinforced plastic having silicon carbide as a reinforcing fiber is preferable in that the linear expansion coefficient of the silicon carbide fiber reinforced plastic is close to the linear expansion coefficient of the substrate to be vapor deposited.

(5) The frame having a rectangular shape, and at a side of the frame to which the mask body is joined, the vacant space being oriented to an outside of the frame from the inside surrounded by the frame, and at a side of the frame to which the mask body is not joined, the frame being formed by the columnar-shaped body in which the unit structure bodies are stacked are preferable in that the frame at any side of the rectangular shaped frame is to be a structure that can most endure a stress due to tension of the mask body.

(6) An end plate formed with a magnetic metal plate being bonded to an entire outer peripheral wall of the frame encompassing the vacant space is preferable in that magnetic field attracting is made possible regardless of the presence/absence of magnetism of the mask body.

(7) The vacant space surrounded by the end plate being depressurized is preferable since heat conduction can be suppressed and a gas exhausting into the vacuum chamber can be suppressed even when the vapor deposition mask is used within the vacuum chamber.

(8) The mask body being a metal mask comprising a thin metal plate, or a film comprising solely a resin film is preferable that the configuration is simplified.

(9) The mask body can be a hybrid type mask in which a resin film on which the aperture pattern is formed is attached to a metal supporting layer comprising an aperture formed so as to not close the aperture pattern of the resin film. Thereby, it is preferable since a stabilized mask can be obtained.

(10) A method of vapor deposition according to a second embodiment of the present invention comprises: arranging a substrate to be vapor deposited and the vapor deposition mask as described in one of (1) to (9) such that the substrate to be vapor deposited and the vapor deposition mask overlap each other; and, depositing a vapor deposition material onto the substrate to be vapor deposited by flying away the vapor deposition material from a vapor deposition source arranged at a distance from the vapor deposition mask.

In the vapor deposition method according to the second embodiment of the present invention, even when the mask body is bonded to a pair of opposing frames with tension being applied, the strength in the axial direction of a frame being sandwiched between the frames to which the mask body is bonded, is sufficiently large, so that the mask body is stably held. As a result, a high definition vapor deposition pattern is obtained in the vapor deposition.

(11) The frame of the vapor deposition mask has a rectangular shape and the vapor deposition mask is positioned in an upright position such that the frame intersects a horizontal plane, the frame comprising the columnar-shaped body in which unit structure bodies are stacked, thereby it is possible to sufficiently endure the self-weight of the mask with the frame while substantially reducing the occupied area (ground area) of the vapor deposition apparatus.

(12) Furthermore, a method for manufacturing an organic EL display apparatus according to a third embodiment of the present invention comprises: forming at least a TFT and a first electrode on a supporting substrate; vapor depositing an organic material above the supporting substrate using the method of vapor deposition that is described in (10) or (11) in the above to form an organic deposition layer; and forming a second electrode on the organic deposition layer.

The method for manufacturing the organic EL display apparatus according to the third embodiment of the present invention makes it easier to install a vapor deposition mask when the organic EL display apparatus is manufactured since the vapor deposition mask is light and causes an uneven thermal expansion of the vapor deposition mask and the substrate to be vapor deposited to be suppressed, making it possible to suppress misalignment between the substrate to be vapor deposited and the vapor deposition mask and to obtain a display panel with a high definition pattern.

DESCRIPTION OF REFERENCE NUMERALS

1 Vapor deposition mask
2 Substrate to be vapor deposited
5 Vapor deposition source
10 Mask body
11 Resin film
11a Aperture
12 Metal supporting layer
12a Aperture
15 Frame
15a Vertical frame
15b Horizontal frame
150 Sandwich structure body
151 Core portion
151a Vacant space (through hole)
151b Thin walled portion
152 End plate
153 Connecting end plate
155 Unit structure body
21 Supporting substrate
22 First electrode
23 Insulation bank
25 Deposition layer
26 Second electrode

The invention claimed is:

1. A vapor deposition mask comprising:
a mask body at which an aperture pattern is formed; and
a frame to which at least a part of a peripheral edge of the mask body is joined to hold the mask body at a certain state,
wherein at least a part of the frame is formed by a columnar-shaped body in which unit structure bodies are stacked via an end plate, each of the unit structure bodies comprising a core portion encompassing a vacant space therein and end plates provided on opposite end surfaces of at least a part of the core portion, thereby forming a sandwich structure,
wherein the unit structure bodies are stacked so as to align along an axis direction of the vacant space, and the end plate between the unit structure bodies stacked is provided on one surface to be connected or both surfaces to be connected of each of the unit structure bodies.

2. The vapor deposition mask according to claim 1, wherein the vacant space of each of the unit structure bodies is formed as a plurality of through holes along a certain direction, and the plurality of through holes are lined up in the same direction.

3. The vapor deposition mask according to claim 1, wherein the core portion of each of the unit structure bodies is formed using a metal or a carbon fiber reinforced plastic.

4. The vapor deposition mask according to claim 3, Wherein the carbon fiber reinforced plastic is a silicon carbide fiber reinforced plastic, the silicon carbide fiber reinforced plastic having silicon carbide as a reinforcing fiber.

5. The vapor deposition mask according to claim 2, wherein the frame has a rectangular shape and at a side of the frame to which the mask body is joined, the frame is formed by a sandwich structure body comprising a core portion encompassing a vacant space therein and end plates provided on both of opposite end surfaces of at least a part of the core portion, and the vacant space is oriented to an outside of the frame from an inside surrounded by the frame, and at a side of the frame to which the mask body is not joined, the frame is formed by the columnar-shaped body.

6. The vapor deposition mask according to claim 1, wherein an end plate formed with a magnetic metal plate is bonded to an entire outer peripheral wall of the frame encompassing the vacant space.

7. The vapor deposition mask according to claim 6, wherein the vacant space surrounded by the end plate formed with the magnetic metal plate is depressurized.

8. The vapor deposition mask according to claim 1, wherein the mask body is a metal mask comprising a thin metal plate, or a film comprising solely a resin film.

9. The vapor deposition mask according to claim 1, wherein the mask body is a hybrid type mask in which a resin film on which the aperture pattern is formed is attached to a metal supporting layer comprising an aperture formed so as to not close the aperture pattern of the resin film.

10. A method of vapor deposition, the method comprising:
arranging a substrate to be vapor deposited and the vapor deposition mask according to claim 1 such that the substrate to be vapor deposited and the vapor deposition mask overlap each other; and,
depositing a vapor deposition material onto the substrate to be vapor deposited by flying away the vapor deposition material from a vapor deposition source arranged at a distance from the vapor deposition mask.

11. The method of vapor deposition according to claim 10, wherein the frame of the vapor deposition mask has a rectangular shape and the columnar-shaped body is positioned in an upright position such that the frame intersects a horizontal plane.

12. A method for manufacturing an organic EL display apparatus, the method comprising:
forming at least a TFT and a first electrode on a supporting substrate;
vapor depositing an organic material above the supporting substrate using the method of vapor deposition according to claim 10 to form an organic deposition layer; and
forming a second electrode on the organic deposition layer.

* * * * *